United States Patent
Sumasu et al.

(10) Patent No.: US 7,418,242 B2
(45) Date of Patent: Aug. 26, 2008

(54) TRANSMISSION DEVICE AND GAIN CONTROL METHOD

(75) Inventors: Atsushi Sumasu, Kanagawa (JP); Shoji Miyamoto, Miyagi (JP); Sadaki Futagi, Ishikawa (JP); Keiji Takakusaki, Kanagawa (JP); Takao Nihei, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 108 days.

(21) Appl. No.: 10/579,062

(22) PCT Filed: Nov. 12, 2004

(86) PCT No.: PCT/JP2004/016865

§ 371 (c)(1),
(2), (4) Date: Jun. 1, 2006

(87) PCT Pub. No.: WO2005/048627

PCT Pub. Date: May 26, 2005

(65) Prior Publication Data

US 2006/0285582 A1   Dec. 21, 2006

(30) Foreign Application Priority Data

Nov. 14, 2003   (JP) .............................. 2003-385081

(51) Int. Cl.
*H04B 1/00* (2006.01)
*H04B 1/40* (2006.01)

(52) U.S. Cl. ...................... 455/70; 455/245.1; 455/522; 370/337

(58) Field of Classification Search .............. 455/245.1, 455/232.1, 234.1, 234.2, 69, 70, 522; 375/345; 370/336, 337, 345, 347

See application file for complete search history.

(56) References Cited

U.S. PATENT DOCUMENTS 6,490,261 B1 * 12/2002 Dent et al. ................. 370/337
6,731,910 B2 * 5/2004 Taira et al. ................. 455/69

FOREIGN PATENT DOCUMENTS

| JP | 8288881 | 11/1996 |
|---|---|---|
| JP | 1051380 | 2/1998 |
| JP | 2003 134025 | 5/2003 |

OTHER PUBLICATIONS

PCT International Search Report dated Mar. 8, 2005.

* cited by examiner

*Primary Examiner*—Lee Nguyen
(74) *Attorney, Agent, or Firm*—Dickinson Wright, PLLC

(57) ABSTRACT

An apparatus that can lower the possibility of failing reception modulation in communication where data is transmitted with and without directivity and prevent deterioration of transmission efficiency caused by retransmission. With this apparatus, a gain control signal multiplex section (203) time division multiplexes a directional transmission signal and a gain control signal. A transmission level control section (204) controls the transmission power level of a gain control signal so that the transmission power level of the gain control signal is smaller than the transmission power level of a directional transmission signal and the received power level of the gain control signal is larger than a received power level of a non-directional transmission signal at the receiving side, and controls the transmission power level of a directional transmission signal so that the received power level of the directional transmission signal is larger than the received power level of a nondirectional transmission signal and the received power level of a gain control signal at the receiving side.

5 Claims, 18 Drawing Sheets

| MODULATION SCHEME | CODING RATE R | MCS NUMBER |
|---|---|---|
| QPSK | R=1/2 | 1 |
| QPSK | R=3/4 | 2 |
| 16QAM | R=1/2 | 3 |
| 16QAM | R=3/4 | 4 |

TRANSMISSION DEVICE AND GAIN CONTROL METHOD

TECHNICAL FIELD

The present invention relates to a transmission apparatus and gain control method for transmitting data with directivity.

BACKGROUND ART

Conventionally, a base station is known that performs adaptive array antenna (hereinafter referred to as "AAA") transmission according to the combined weight for each diversity branch obtained upon AAA reception. By using this technique, the reception electric field strength increases at a mobile station in downlink, and interference against mobile stations connected to another base station which has been interference source upon reception decreases.

In a system employing AAA transmission, cases might occur where nondirectional communication and directional communication both exist (for example, see Patent Document 1.) In the case where nondirectional signals as well as directional signals are transmitted—particularly in the case where AAA is used in downlink—pilot signals and control signals generally required for all terminals are transmitted without directivity, and dedicated data for each terminal is transmitted with directivity. Hereinafter, control signals required for all terminals transmitted without directivity will be referred to as nondirectional transmission signals, and dedicated data for each terminal transmitted with directivity will be referred to as directional transmission signals. In view of received signal level at each terminal, the possibility is larger that received signal level increases in the case where directional signals are received than the case where nondirectional signals are received. Furthermore, in the case of a system where data for a terminal is transmitted in bursts, while nondirectional signals are received at low power level, suddenly directional signals at large power level are received.

FIG. 1A and FIG. 1B illustrate relationship between the received power level and the received timing of conventional nondirectional received signals #11, #13 and a directional received signal #12. As shown in FIG. 1A, processing of increasing the dynamic range starts for the first time at time t10 when directional received signal #12 is received. By this means, a dynamic range including the power level of directional received signal #12 is set at time t11.

Patent Document 1: Japanese Patent Application Laid-Open No. 2003-134025

DISCLOSURE OF INVENTION

Problems to be Solved by the Invention

A conventional transmission apparatus and gain control method generally control the input level of a received signal so that a dynamic range of a reception analog/digital converter is efficiently used by automatic gain control (AGC). However, there is a problem that when signal level suddenly increases, as shown in FIG. 1B, setting of a dynamic range supporting large signal levels is delayed for time (t11-t10), and, as a result, automatic gain control cannot follow and reception demodulation fails. When reception demodulation fails, retransmission is required. However, there is a problem that, in the case where directional communication is performed in bursts and lasts only a short time, overhead of retransmission increases and transmission efficiency deteriorates.

It is therefore an object of the present invention to provide a transmission apparatus and gain control method that make it possible to lower the possibility of failing reception demodulation in communication where data is transmitted with and without directivity and prevent deterioration of transmission efficiency caused by retransmission.

Means for Solving the Problem

The transmission apparatus according to the present invention adopts a configuration having a gain control signal generating section that generates a gain control signal that is a signal for adjusting a gain for a received signal of a communicating party, a gain control signal multiplex section that time division multiplexes a directional transmission signal and the gain control signal so that the gain control signal is transmitted a predetermined time before a frame in which the directional transmission signal is transmitted in bursts, a transmission level control section that sets a transmission power level of the gain control signal so that a transmission power level of the gain control signal is smaller than a transmission power level of the directional transmission signal and a received power level of the gain control signal is larger than a received power level at a communicating party of a nondirectional transmission signal, and a transmission section that transmits the directional transmission signal and the gain control signal having the transmission power level set at the transmission level control section with directivity and transmits the nondirectional transmission signal without directivity.

The transmission apparatus according to the present invention adopts a configuration having a transmission level control section that sets a transmission power level of a directional transmission signal transmitted in bursts so that a received power level at a communicating party becomes gradually larger up to a predetermined level, and a transmission section that transmits the directional transmission signal at the transmission power level set at the transmission level control section with directivity and transmits the nondirectional transmission signal without directivity.

The transmission apparatus according to the present invention adopts a configuration having a control signal multiplex section that time division multiplexes a directional transmission signal and power level information so that power level information that is information of a received power level at the communicating party of the directional transmission signal is transmitted to the communicating party before the directional transmission signal is transmitted, and a transmission section that transmits with directivity the power level information and the directional transmission signal multiplexed at the control signal multiplex section.

A reception apparatus according to the present invention adopts a configuration having a received level detecting section that obtains a received power level of a gain control signal that is a signal for adjusting a gain for a received signal included in the received signal and a received power level of the received signal other than the gain control signal, a gain setting section that sets a gain based on a received power level of the gain control signal measured at the received level detecting section and a received power level of the received signal other than the gain control signal, and a gain adjusting section that amplifies a gain for the received signal at the gain set at the gain setting section.

The reception apparatus according to the present invention adopts a configuration having a gain setting section that sets a gain corresponding to power level information that is information indicating a received power level after a predetermined time included in a received signal, and a gain adjusting section that amplifies the received signal by the gain set at the gain setting section.

A gain control method according to the present invention has steps of generating a gain control signal that is a signal for adjusting a gain for a received signal of a communicating party, time division multiplexing a directional signal and the gain control signal so that the gain control signal is transmitted a predetermined time before a frame in which the directional signal is transmitted in bursts, setting a transmission power level of the gain control signal so that the transmission power level of the gain control signal is smaller than a transmission power level of the directional signal and a received power level of the gain control signal is larger than a received power level at a communicating party of a nondirectional signal, transmitting the directional signal and the gain control signal at the set transmission power level with directivity and transmitting the nondirectional signal without directivity, and controlling a gain at a dynamic range including the received power level of the received nondirectional signal, gain control signal and directional signal.

A gain control method according to the present invention has steps of setting a transmission power level of a directional signal transmitted in bursts so that a received power level at a communicating party becomes gradually larger up to a predetermined level, transmitting the directional signal at the set transmission power level with directivity and transmitting the nondirectional signal without directivity, and controlling a gain at a dynamic range including the received power level of the received nondirectional signal and directional signal.

ADVANTAGEOUS EFFECT OF THE INVENTION

According to the present invention, in communication where data is transmitted with and without directivity, it is possible to lower the possibility of failing reception demodulation and prevent deterioration of transmission efficiency caused by retransmission.

BEST MODE FOR CARRYING OUT THE INVENTION

Embodiments of the present invention will be described in detail below with reference to the accompanying drawings.

Embodiment 1

Figure 1A:
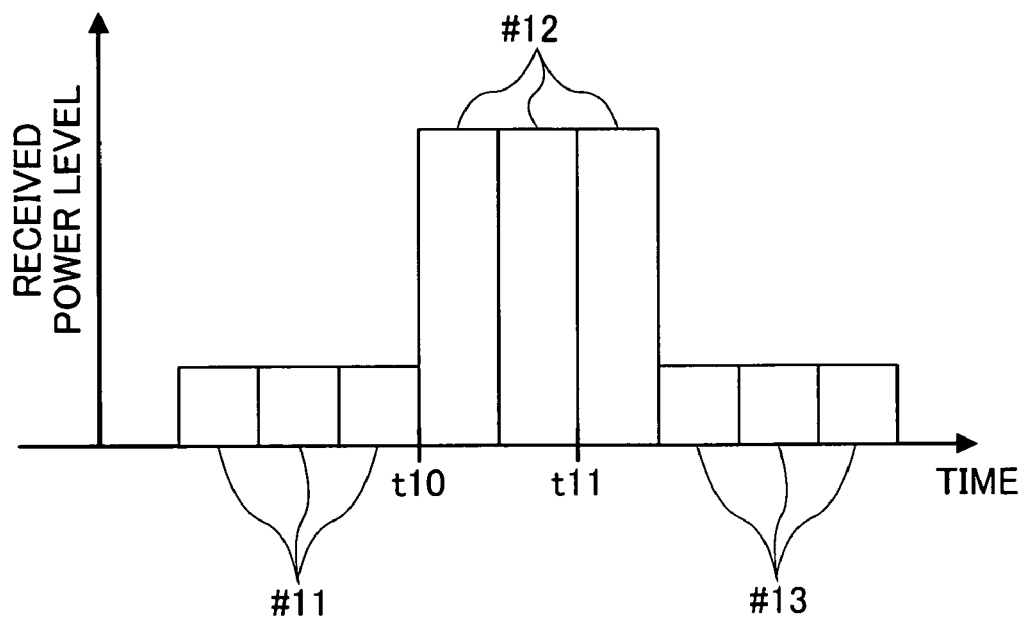
FIG. 1A illustrates relationships between the conventional received power level and the received timing.
Figure 1B:
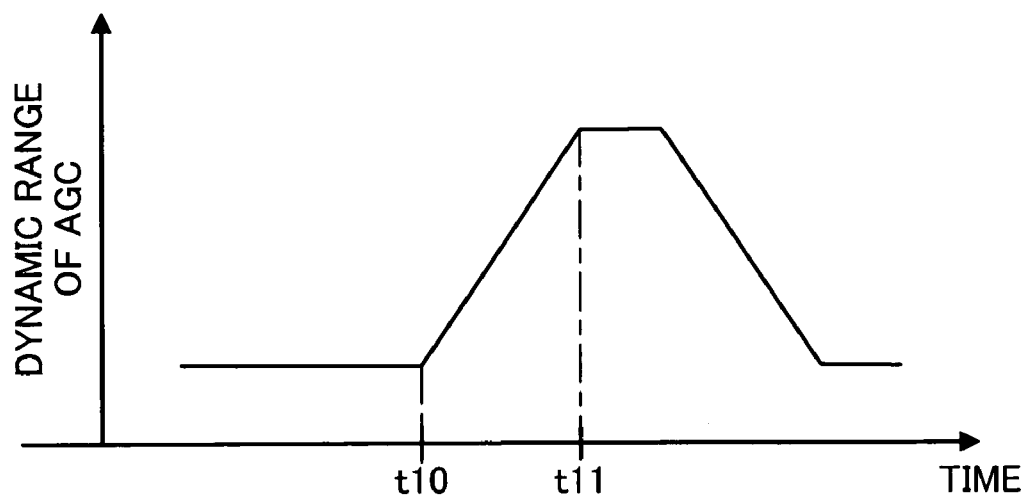
FIG. 1B illustrates the conventional change of the range of a dynamic range of AGC as time passes.
Figure 2:
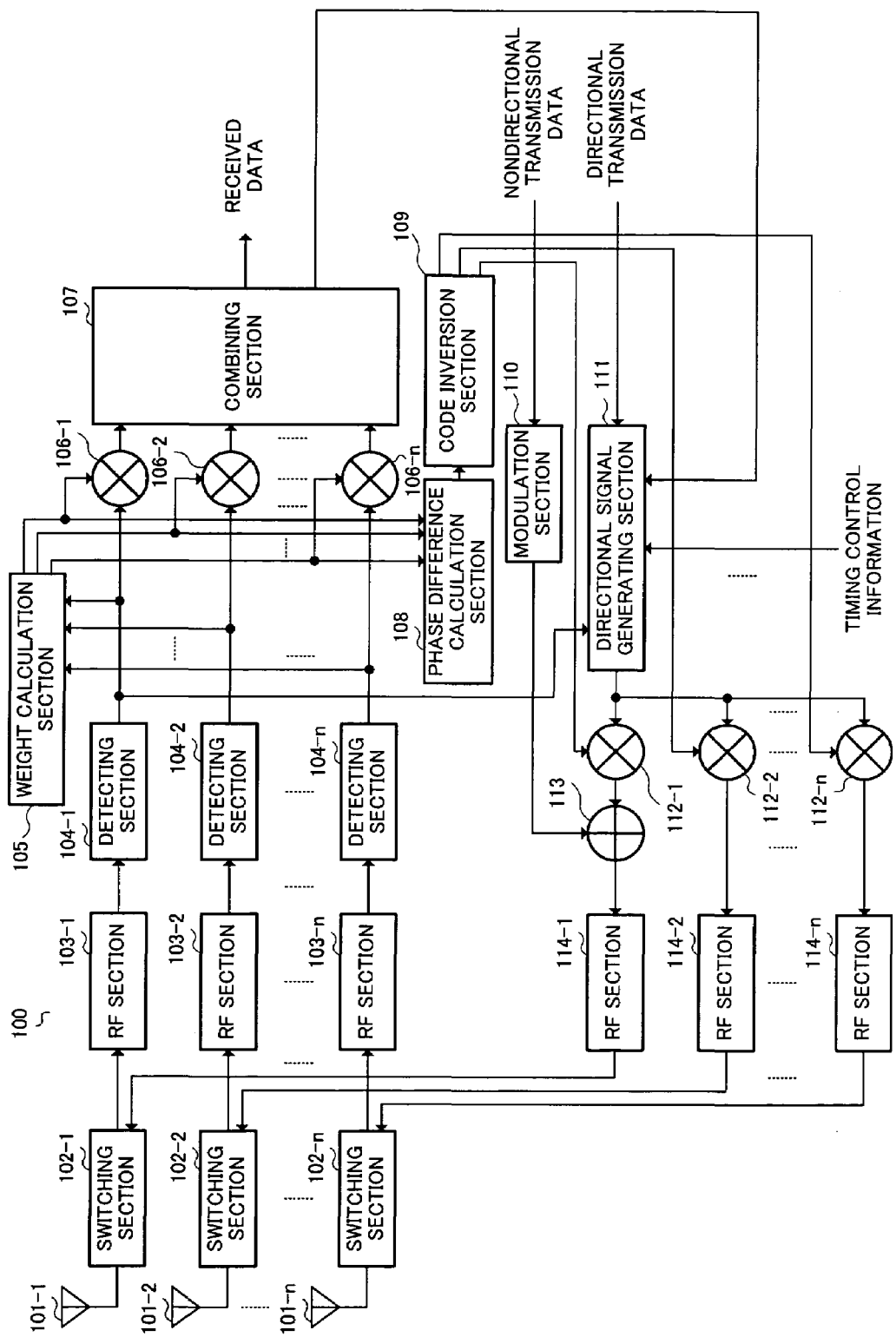
FIG. 2 is a block diagram showing a configuration of a transmission/reception apparatus according to Embodiment 1 of the present invention.

FIG. 2 is a block diagram showing a configuration of a transmission/reception apparatus according to Embodiment 1 of the present invention.

Switching sections 102-1 to 102-n switch between outputting received signals received at antennas 101-1 to 101-n to RF sections 103-1 to 103-n and transmitting transmission signals inputted from RF sections 114-1 to 114-n from antennas 101-1 to 101-n.

RF sections 103-1 to 103-n down-convert received signals inputted from switching sections 102-1 to 102-n from radio frequency to baseband frequency, and output the results to detecting sections 104-1 to 104-n.

Detecting section 104-1 performs quadrature detection on a received signal inputted from RF section 103-1 and outputs the quadrature detection result to weight calculation section 105 and multiplier 106-1. That is, detecting section 104-1 performs quadrature detection on a received signal inputted from RF section 103-1 and thereby outputs a complex baseband signal in which the I component and Q component are respectively the real part and imaginary part, to weight calculation section 105, multiplier 106-1 and directional signal generating section 111.

Detecting sections 104-2 to 104-n perform quadrature detection on received signals inputted from RF sections 103-2 to 103-n and output the quadrature detection results to weight calculation section 105 and multipliers 106-2 to 106-n. That is, detecting sections 104-2 to 104-n perform quadrature detection on received signals inputted from RF sections 103-2 to 103-n, and output complex baseband signals in which the I component and Q component are respectively the real part and imaginary part, to weight calculation section 105 and multipliers 106-2 to 106-n.

Weight calculation section 105 calculates combined weight where desired signals reinforce each other and interference signals cancel each other, according to the baseband signals inputted from detecting sections 104-1 to 104-n, and outputs the calculated combined weight to multipliers 106-1 to 106-n, and outputs information of the calculated combined weight to phase difference calculation section 108.

Multipliers 106-1 to 106-n assign weight by multiplying the baseband signals inputted from detecting sections 104-1 to 104-n by the combined weight inputted from weight calculation section 105, and output the weighted baseband signals to combining section 107.

Combining section 107 performs additive combining with the weighted baseband signals inputted from multipliers 106-1 to 106-n, and outputs the results to directional signal generating section 111, and obtains received data.

Phase difference calculation section 108 detects the phase difference of each branch from information of the combined weight inputted from weight calculation section 105, and outputs the result to code inversion section 109.

Code inversion section 109 inverts the positivity and negativity of the signals in phase difference information of each branch inputted from phase difference calculation section 108 and outputs the result to multipliers 112-1 to 112-n.

Modulation section 110 modulates the inputted nondirectional transmission data, generates a nondirectional transmission signal, and outputs the generated nondirectional transmission signal to adder 113.

Directional signal generating section 111 modulates directional transmission data, generates a directional transmission signal, time division multiplexes the directional transmission signal and the gain control signal based on timing control information, and generates a directional transmission signal to transmit in bursts. The directional transmission signal is, for example, dedicated data of dedicated channel and is unique data for each communicating party. The gain control signal is a signal that has a predetermined power level and is used upon gain control at a receiving side and is not used to transmit data. Furthermore, directional signal generating section 111 sets the transmission power level of the gain control signal and the transmission power level of the directional transmission signal. After setting of the transmission power level and the processing of time division multiplexing are completed, directional signal generating section 111 outputs a directional signal composed of a gain control signal and a directional transmission signal to multipliers 112-1 to 112-n. In addition, directional signal generating section 111 will be described in detail below.

Multipliers 112-1 to 112-n multiply the phase difference from phase difference information which is the information after phase inversion inputted from code inversion section 109 by the directional transmission signal inputted from directional signal generating section 111. Multiplier 112-1 multiplies the phase difference by the directional transmission signal and outputs the result to adder 113, and multipliers 112-2 to 112-n multiply phase differences by the directional transmission signals and output the results to RF sections 114-2 to 114-n.

Adder 113 adds the directional transmission signal inputted from multiplier 112-1 and the nondirectional transmission signal inputted from modulation section 110, and outputs the result to RF section 114-1.

RF section 114-1 up-converts the directional transmission signal and nondirectional signal inputted from adder 113 from base band frequency to radio frequency, and amplifies them to predetermined transmission level and outputs them to switching section 102-1.

RF sections 114-2 to 114-n up-convert the signals in which phase difference inputted from multipliers 112-2 to 112-n is multiplexed by the directional transmission signals from baseband frequency to radio frequency, amplify them to a predetermined transmission level, and output the results to switching sections 102-2 to 102-n.

Figure 3:
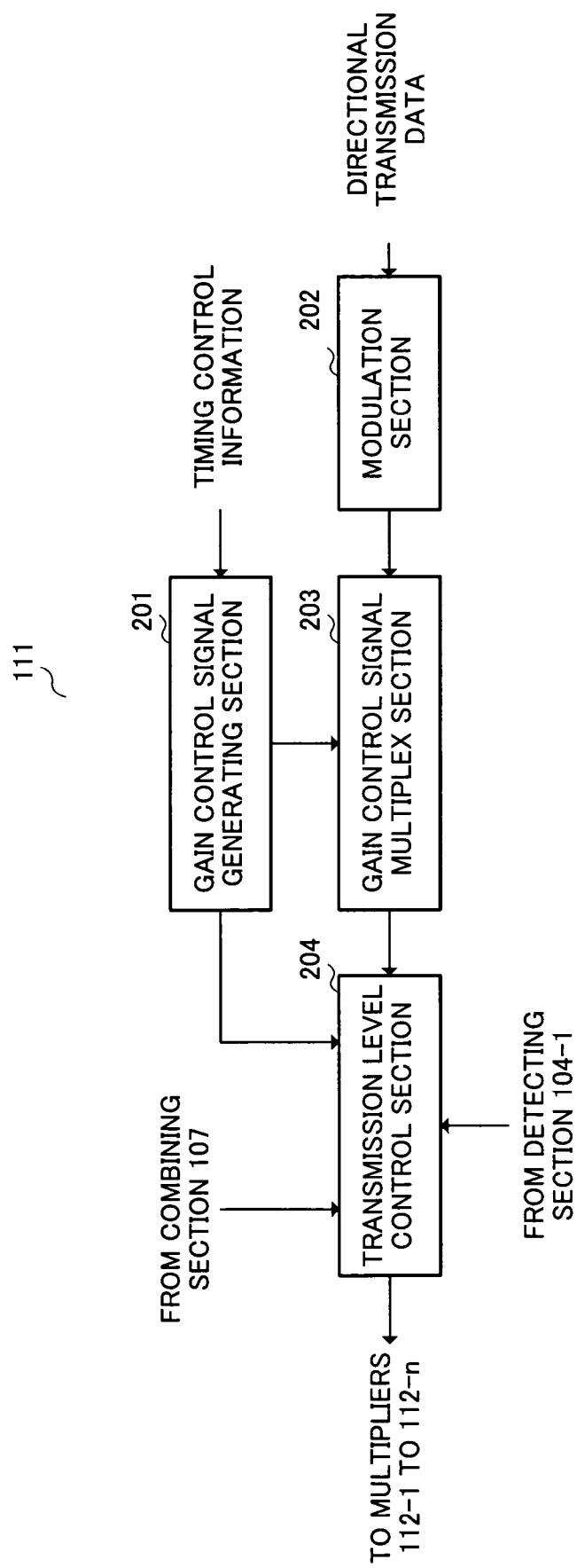
FIG. 3 is a block diagram showing a configuration of a directional signal generating section according to Embodiment 1 of the present invention.

Directional signal generating section 111 will be described in detail below using FIG. 3. FIG. 3 is a block diagram showing a configuration of directional signal generating section 111.

When timing control information is inputted at a timing two frames before the frame in which a directional transmission signal is transmitted, gain control signal generating section 201 generates and outputs to gain control signal multiplex section 203 a gain control signal When the gain control signal is outputted to gain control signal multiplex section 203, gain control signal generating section 201 outputs timing information indicating a timing when the gain control signal has been outputted, to transmission level control section 204.

Modulation section 202 modulates the directional transmission data and outputs the result to gain control signal multiplex section 203.

Gain control signal multiplex section 203 time division multiplexes the directional transmission signal inputted from modulation section 202 and the gain control signal inputted from gain control signal generating section 201, and outputs time division multiplexed directional transmission signal and gain control signal to transmission level control section 204.

When a timing control signal is not inputted from gain control signal generating section 201, transmission level control section 204 controls the transmission power level so that the received power level of the directional transmission signal at the receiving side that is a communicating party is larger than the received power level of the nondirectional transmission signal at the receiving side. Furthermore, transmission level control section 204 controls the transmission power level so that at the timing when a timing control signal is inputted from gain control signal generating section 201, the transmission power level of the gain control signal time division multiplexed by gain control signal multiplex section 203 is smaller than the transmission power level of the directional transmission signal, and the received power level is larger than the received power level of the nondirectional transmission signal at the receiving side. Transmission level control section 204 also controls the transmission power level of the directional transmission signal so that at the timing when the directional transmission signal time division multiplexed by gain control signal multiplex section 203 is inputted, the received power level of the directional transmission signal is larger than the received power level of the nondirectional transmission signal and the gain control signal at the receiving side. After the transmission power level is set, transmission level control section 204 outputs the directional transmission signal and the gain control signal to multipliers 112-1 to 112-n. As a method for controlling transmission power level of the gain control signal so that the received power level of the gain control signal is larger than the received power level of the nondirectional transmission signal at the receiving side, transmission control section 204 obtains a received power level ratio between the received signal at one antenna 101-1 inputted from detecting section 104-1 and the received signal received with directivity inputted from combining section 107, and sets the transmission power level of the gain control signal so that a value dividing the transmission power level of the gain control signal by the obtained received power level ratio of the received signal at one antenna 101-1 and the received power level of the received signal received with directivity is larger than the transmission power level of the nondirectional transmission signal. The power level required for transmitting the directional transmission signal and nondirectional transmission signal varies between systems.

Figure 4:
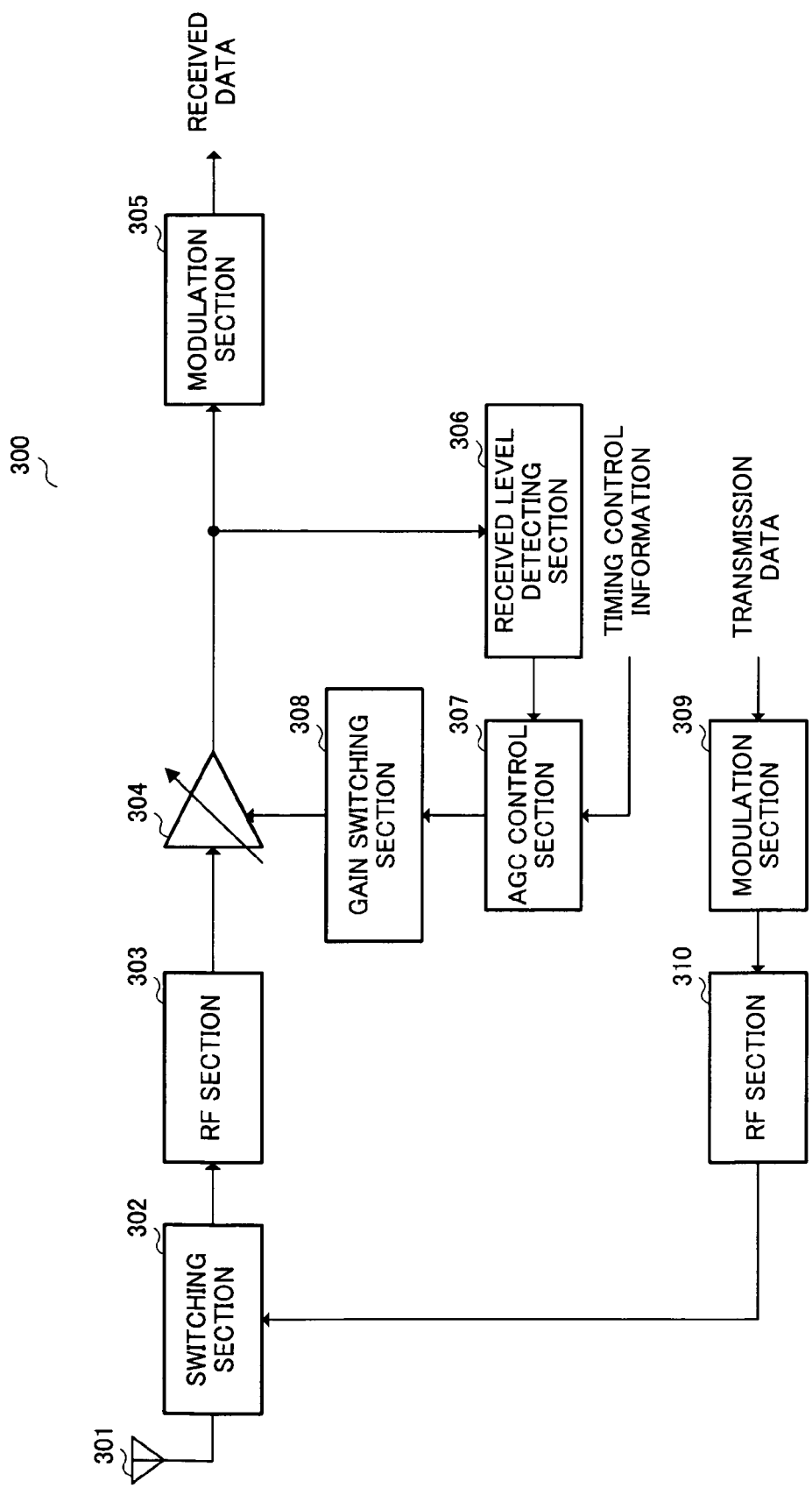
FIG. 4 is a block diagram showing a configuration of a transmission/reception apparatus according to Embodiment 1 of the present invention.

A configuration of transmission/reception apparatus 300 that is a communicating party of transmission/reception apparatus 100 will be described below using FIG. 4. FIG. 4 is a block diagram showing a configuration of transmission/reception apparatus 300.

Switching section 302 switches between outputting received signals received at antenna 301 to RF section 303 and transmitting transmission signals inputted from RF section 310 from antenna 301.

RF section 303 down-converts a received signal inputted from switching section 302 from radio frequency to baseband frequency and outputs the result to variable gain amplifier 304.

Variable gain amplifier 304 is a gain adjusting means and an amplifier having a variable gain, amplifies the received signal by control of gain switching section 308. Demodulation section 305 demodulates the received signal and obtains received data.

Received level detecting section 306 measures the received level of the received signal inputted from variable gain amplifier 304, and outputs measurement value information that is information of measurement value of the received level to AGC control section 307. When the gain control signal is received, received level detecting section 306 measures larger received level than the received level in the case where the nondirectional transmission signal is received and smaller received level than the received level in the case where the directional transmission signal is received, as the received level of the gain control signal.

AGC control section 307 is a gain setting means and determines a gain for variable gain amplifier 304 so that the received level measured by received level detecting section 306 is a predetermined received level, and outputs gain information, which is information of the determined gain, to gain switching section 308. Specifically, when a gain control signal is not received, AGC control section 307 averages the measurement values of the received level over a predetermined time and obtains an average value from measurement value information of the received level inputted from received level detecting section 306 and determines a gain corresponding to the average value of the obtained received level. On the other hand, when a gain control signal is received, AGC control section 307 cancels the processing of averaging measurement values of the received level and determines a gain corresponding to the measurement value of the received level from measurement value information of the received level of the gain control signal inputted from received level detecting section 306. Until a directional transmission signal transmitted from transmission/reception apparatus 100 is received, AGC control section 307 updates and holds the gain that is set based on the received level of the gain control signal every time a gain control signal is received. AGC control section 307 can learn the timing when the gain control signal is inputted from timing control information. The timing when the gain control signal is inputted is predetermined by system or is reported by control information.

Gain switching section 308 controls variable gain amplifier 304 to have the gain specified by gain information inputted from AGC control section 307. Therefore, desired gain information is inputted from AGC control section 307 at the timing when the gain control signal is received, and thereby gain switching section 308 sets the desired gain before AGC is performed on the directional transmission signal.

Modulation section 309 modulates transmission data and outputs the result to RF section 310.

RF section 310 up-converts the transmission data inputted from modulation section 309 from baseband frequency to radio frequency and outputs the result to switching section 302.

Figure 5A:
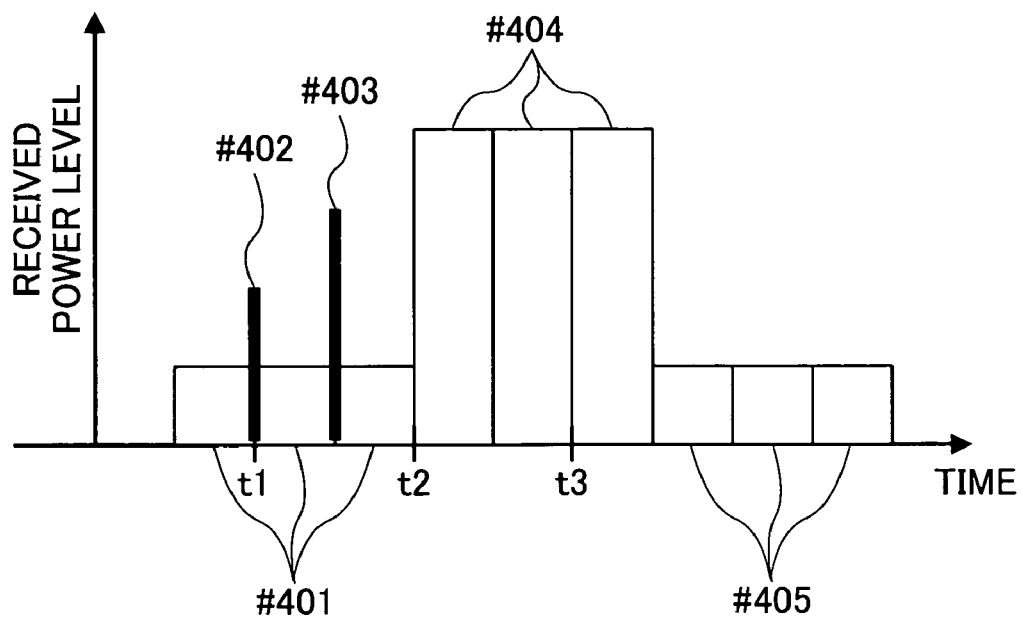
FIG. 5A illustrates relationships between the received power level and the received timing according to Embodiment 1 of the present invention.
Figure 5B:
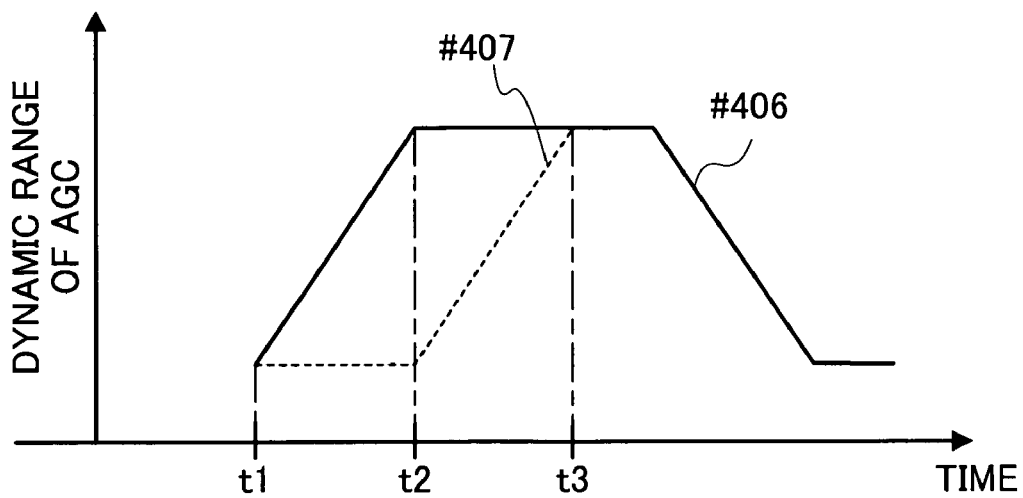
FIG. 5B illustrates the change of the range of a dynamic range of AGC as time passes according to Embodiment 1 of the present invention.

FIG. 5A illustrates relationships between the received timing and the received power level of nondirectional received signals #401 and #405, directional received signal #404, and gain control signals #402 and #403 received at transmission/reception apparatus 300 at the receiving side. FIG. 5B illustrates the change of the range of a dynamic range of AGC as time passes. In FIG. 5B, solid line #406 is the range of a dynamic range in the case where gain control signals #402 and #403 are received and dotted line #407 is the range of a dynamic range in the case where gain control signals #402 and #403 are not received. As shown in FIG. 5A and FIG. 5B, the received power level of directional received signal #404 is considerably larger than the received power level of nondirectional received signals #401 and #405. The time axis in FIG. 5A is corresponded with the time axis in FIG. 5B.

As shown in FIG. 5A, at time t1 when the frame two frames before the frame including directional received signal #404 is received, transmission/reception apparatus 300 receives gain control signal #402 at a power level larger than the power level of nondirectional received signal #401 and smaller than the power level of directional received signal #404. By this means, a gain is controlled at the receiving side according to the received level of gain control signal #402, and therefore, as shown in FIG. 5B, the dynamic range can be increased from time t1. Further, in the next frame of the frame including gain control signal #402, transmission/reception apparatus 300 receives gain control signal #403 at a power level larger than the power level of nondirectional received signal #401 and gain control signal #402 and smaller than the power level of directional received signal #404. By this means, transmission/reception apparatus 300 controls a gain according to gain control signal #402, and thereby, at time t2 when directional received signal #404 is received, sets a dynamic range including the power level of directional received signal #404.

On the other hand, when a conventional dynamic range indicated by the dotted line in FIG. 5B is set, gain control signals #402 and #403 are not received, and at time t2 when directional received signal #404 is received, the processing of increasing a dynamic range starts for the first time, and thereby a dynamic range including the power level of directional received signal #404 is set at time t3, and, compared to the case where gain control signals #402 and #403 are transmitted, time is delayed for (t3-t2) when a dynamic range including the power level of directional received signal #404 is set.

In this way, according to Embodiment 1, a gain control signal where the transmission power level is set so that the transmission power level of the gain control signal is smaller than the transmission power level of a directional transmission signal and the received power level of the gain control signal is larger than the received power level of a nondirectional transmission signal at the receiving side, is transmitted predetermined frames before the frame in which the transmission of a directional transmission signal starts, thereby making it possible to set at the receiving side a large dynamic range based on received power level of the gain control signal before the directional transmission signal is received. By this means, it is possible to lower the possibility of failing reception demodulation and prevent deterioration of transmission efficiency caused by retransmission. According to Embodiment 1, a gain control signal is transmitted with directivity, so that it is possible to prevent increasing interference against other reception apparatus.

A case has been explained in Embodiment 1 where a gain control signal is transmitted twice at predetermined interval, but this is by no means limiting and is also applicable to cases where a gain control signal is transmitted three times or more at predetermined intervals or continuously transmitted in a predetermined period. Furthermore, a case has been explained in Embodiment 1 where a gain control signal is transmitted for each frame, but this is by no means limiting and is also applicable to cases where a gain control signal is transmitted at an arbitrary timing such as for each slot. Still further, a case has been explained in Embodiment 1 where a gain control signal is transmitted in the frame two frames before the frame in which the transmission of the directional transmission signal starts, but this is by no means limiting and is also applicable to cases where a gain control signal is transmitted in other frames than the frame two frames before the frame in which the transmission of the directional transmission signal starts or in the same frame as the frame in which the transmission of the directional transmission signal starts.

Embodiment 2

Figure 6:
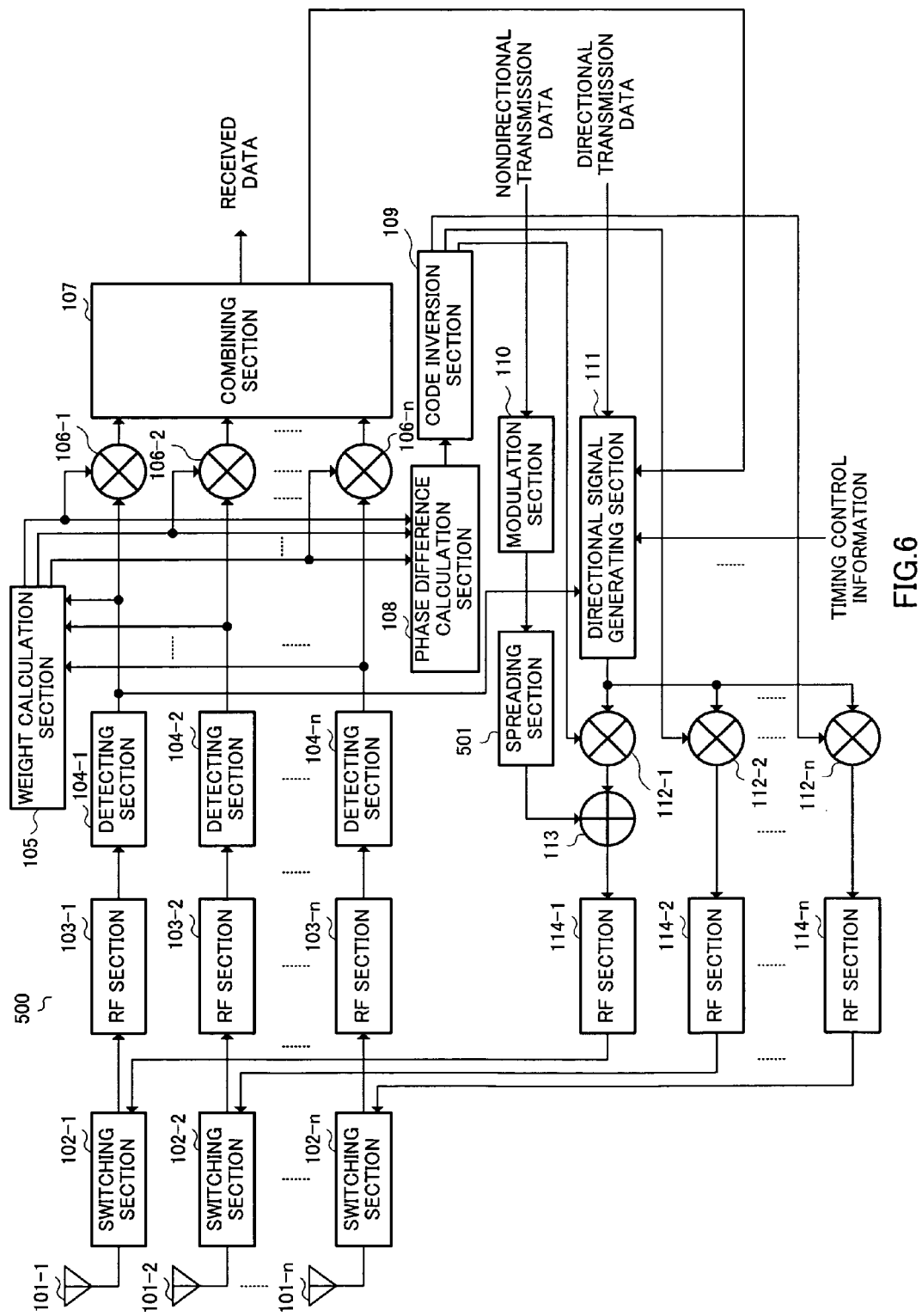
FIG. 6 is a block diagram showing a configuration of a transmission/reception apparatus according to Embodiment 2 of the present invention.

FIG. 6 is a block diagram showing a configuration of transmission/reception apparatus 500 according to Embodiment 2 of the present invention.

As shown in FIG. 6, a transmission/reception apparatus 500 according to Embodiment 2 of the present invention adds spreading section 501 to transmission/reception apparatus 100 according to Embodiment 1 shown in FIG. 2. In addition, parts in FIG. 6 that have identical configurations with ones in FIG. 2 will be assigned the same codes as in FIG. 2 without further explanations. Furthermore, a reception apparatus that is a communicating party of transmission/reception apparatus 500 has the same configuration as FIG. 4, and therefore the explanation thereof is omitted.

Spreading section 501 performs spreading processing on a nondirectional transmission signal inputted from modulation section 110 using predetermined spreading codes and outputs the result to adder 113.

Adder 113 is a code multiplex means and adds a directional transmission signal inputted from adder 112-1 and a nondirectional transmission signal inputted from spreading section 501, and thereby code multiplexes the gain control signal and the nondirectional transmission signal and outputs the result to RF section 114-1.

Figure 7:
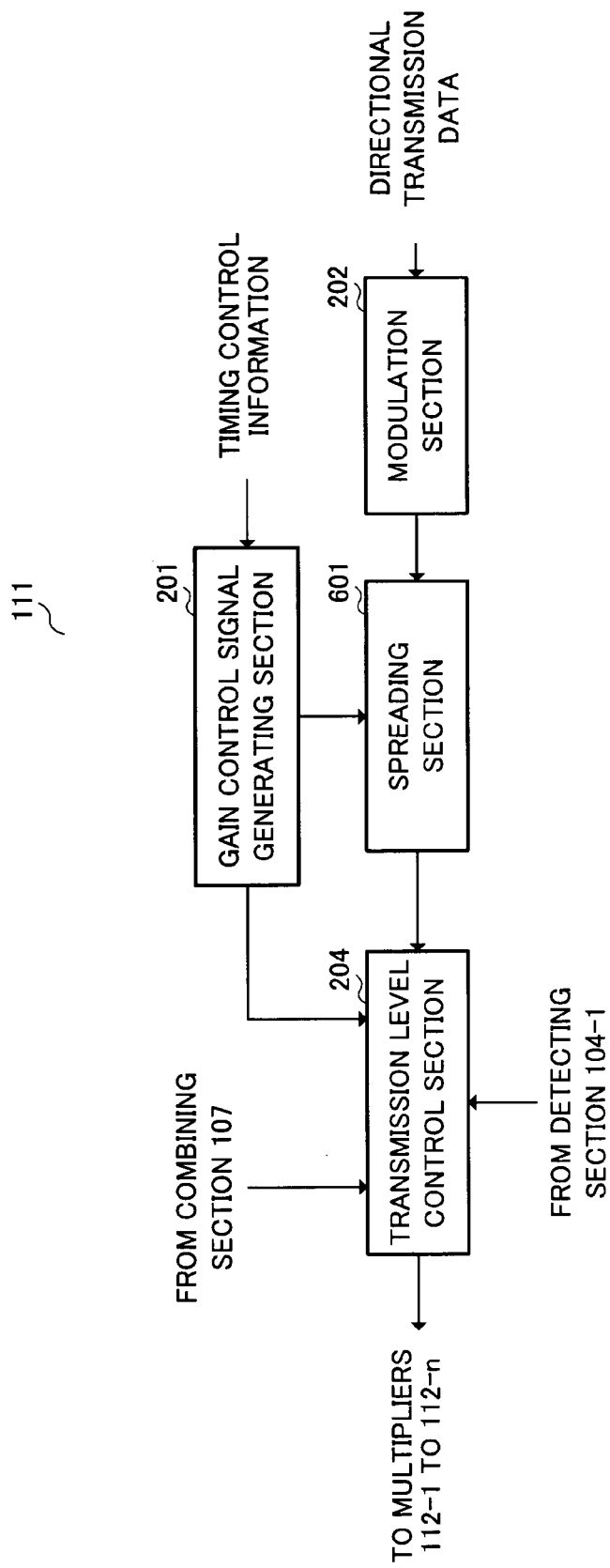
FIG. 7 is a block diagram showing a configuration of a directional signal generating section according to Embodiment 2 of the present invention.

Next, a configuration of directional signal generating section 111 will be described using FIG. 7. FIG. 7 is a block diagram of a configuration of directional signal generating section 111.

As shown in FIG. 7, directional signal generating section 111 according to Embodiment 2 of the present invention removes gain control signal multiplex section 203 from directional signal generating section 111 according to Embodiment 1 as shown in FIG. 3, and adds spreading section 601. In addition, parts in FIG. 7 that have identical configurations with ones in FIG. 3 will be assigned the same codes as in FIG. 3 without further explanations.

Spreading section 601 performs spreading processing and time division multiplexing on a directional transmission signal inputted from modulation section 202 and a gain control signal inputted from gain control signal generating section 201 using predetermined spreading codes, generates a directional transmission signal, and outputs the generated directional transmission signal to transmission level control section 204.

Transmission level control section 204 controls the transmission power level so that in the case where timing control signal is not inputted from gain control signal generating section 201 the received power level of the directional transmission signal at the receiving side is larger than the received power level of the nondirectional transmission signal. Furthermore, transmission level control section 204 controls the transmission power level so that in the case where a timing control signal is inputted from gain control signal generating section 201 at the timing when a time multiplexed gain control signal is inputted from spreading section 601, the transmission power level of the gain control signal is smaller than the transmission power level of the directional transmission signal, and a transmission power level becomes higher as the frame in which the directional transmission signal is transmitted is approached, and at the timing when the time division multiplexed directional transmission signal is inputted from spreading section 601, the transmission power level of the directional transmission signal is sufficiently larger than the received power level of the nondirectional transmission signal and the gain control signal at the receiving side. Then, transmission level control section 204 outputs a directional transmission signal and gain control signal to adder 112-1 to 112-n after a transmission power level is set.

Figure 8:
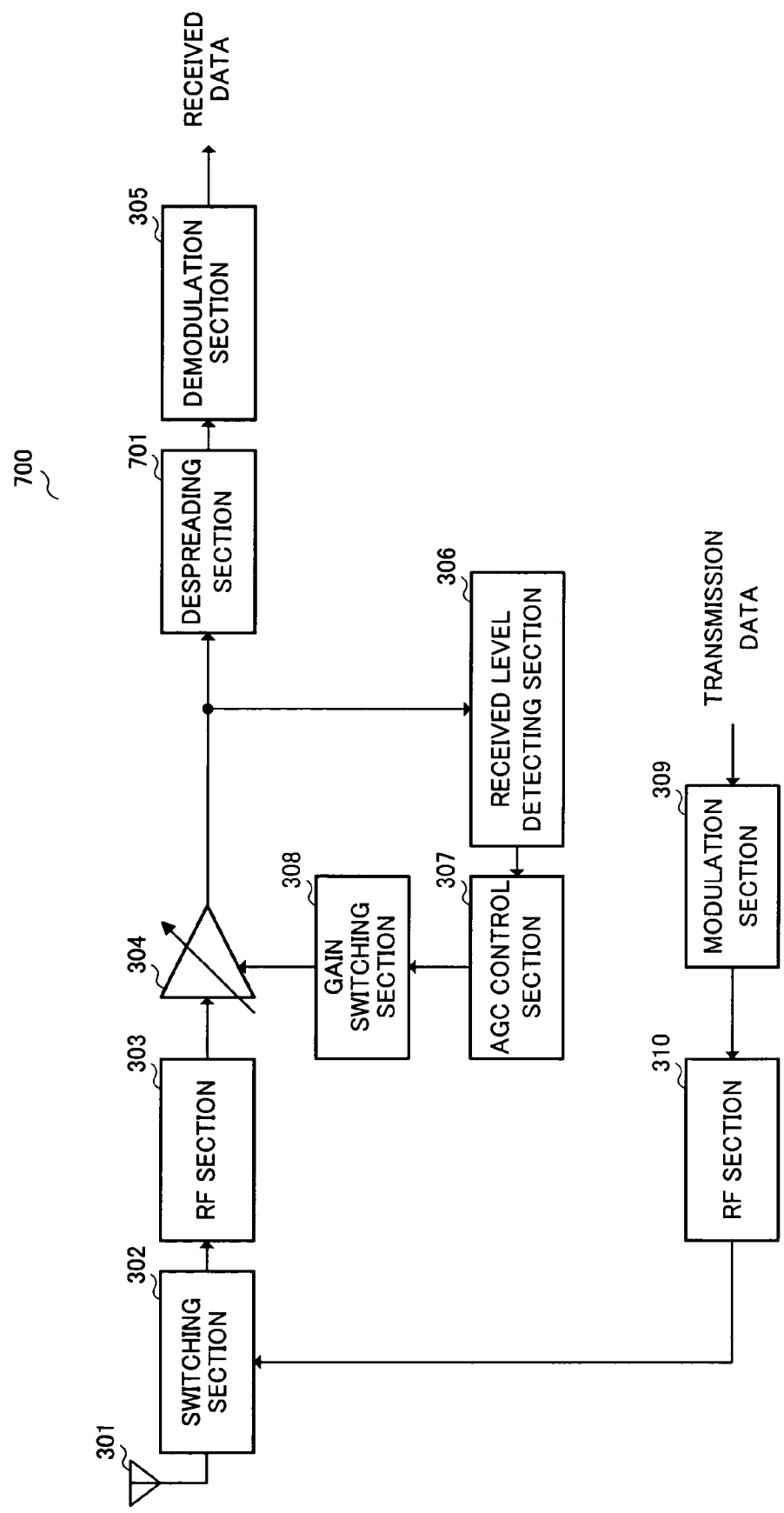
FIG. 8 is a block diagram showing a configuration of a transmission/reception apparatus according to Embodiment 2 of the present invention.

Next, a configuration of transmission/reception apparatus 700 that is a communicating party of transmission/reception apparatus 500 will be described using FIG. 8. FIG. 8 is a block diagram showing a configuration of transmission/reception apparatus 700.

As shown in FIG. 8, transmission/reception apparatus 700 according to Embodiment 2 adds despreading section 701 to transmission/reception apparatus 300 according to Embodiment 1 shown in FIG. 4. In addition, parts in FIG. 8 that have identical configurations with ones in FIG. 4 will be assigned the same codes as in FIG. 4 without further explanations.

Received level detecting section 306 measures the received level of a received signal inputted from variable gain amplifier 304 and outputs the measurement result to AGC control section 307. Therefore, received level detecting section 306 measures a larger received level in the case where a received signal in which a gain control signal and a nondirectional transmission signal are code multiplexed is received than the received level in the case where only nondirectional signal is received, and a smaller received level than the received level in the case where a received signal in which a directional transmission signal and a nondirectional transmission signal are code multiplexed is received, as the received level of the received signal in which a gain control signal and a nondirectional transmission signal are code multiplexed.

AGC control section 307 determines a gain for variable gain amplifier 304 so that the received level measured at received level detecting section 306 is a desired received level, and outputs the gain information that is information of the determined gain to gain switching section 308. That is, AGC control section 307 averages the measurement results of the received level inputted from received level detecting section 306 over a predetermined time and determines a gain according to the averaged received level. In addition, AGC control section 307 performs the same processing in the case where a received signal in which a gain control signal and a nondirectional transmission signal are code multiplexed is inputted as in the case where a received signal in which a directional transmission signal and a nondirectional transmission signal are code multiplexed is inputted and the case where only nondirectional transmission signal is inputted.

Despreading section 701 despreads the received signal inputted from variable gain amplifier 304 and outputs the results to demodulation section 305.

Figure 9:
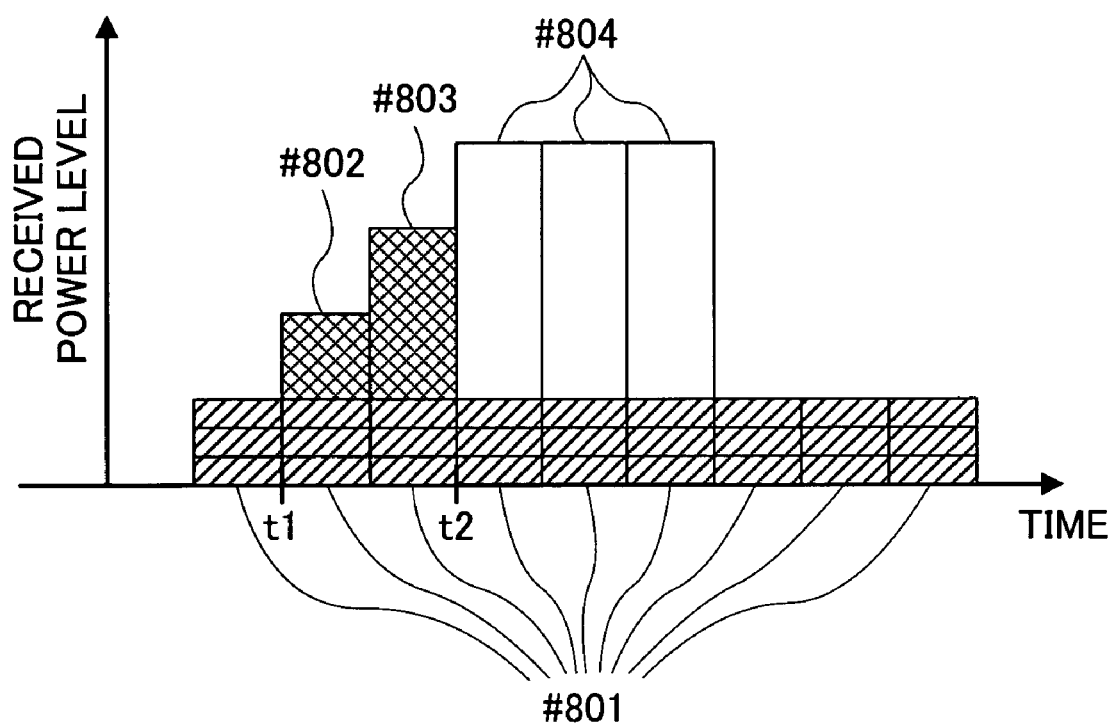
FIG. 9 illustrates relationships between the received power level and the received timing according to Embodiment 2 of the present invention.

FIG. 9 illustrates relationships between the received timing and the received power level of nondirectional received signal #801, directional received signal #804 and gain control signal #802 and #803, received at a reception apparatus. In addition, a view showing the change of the range of a dynamic range of AGC as time passes is the same as FIG. 5B, therefore the explanation thereof is omitted.

As shown in FIG. 9, a reception apparatus receives a received signal in which nondirectional received signal #801 and gain control signal #802 are code multiplexed at time t1 when a frame two frames before the frame including directional received signal #804 is received. The received signal in which nondirectional received signal #801 and gain control signal #802 are code multiplexed has a larger power level corresponding to the gain control signal #802 multiplex than the power level of nondirectional received signal #801. Furthermore, a received signal in which nondirectional received signal #801 and gain control signal #802 are code multiplexed has a smaller power level than the power level of a received signal in which nondirectional received signal #801 and directional received signal #804 are code multiplexed. Therefore, transmission/reception apparatus 700 at the receiving side, controls a gain according to the received power level of a received signal in which gain control signal #802 and nondirectional transmission signal #801 are code multiplexed, thereby making it possible to increase a dynamic range from time t1.

Furthermore, transmission/reception apparatus 700 receives a received signal in which nondirectional received signal #801 and gain control signal #803 are code multiplexed in the next frame of the frame including gain control signal #802. The received signal in which nondirectional received signal #801 and gain control signal #803 are code multiplexed has a larger power level corresponding to the gain control signal #803 multiplex than the power level of nondirectional received signal #801. The power level of gain control signal #803 is larger than the power level of gain control signal #802, and therefore is larger than the power level of a received signal in which nondirectional received signal #801 and gain control signal #802 are code multiplexed. In addition, a received signal in which nondirectional received signal #801 and gain control signal #803 are code multiplexed has a smaller power level than the power level of a received signal in which nondirectional received signal #801 and directional received signal #804 are code multiplexed. By this means, transmission/reception apparatus 700 performs gain control according to the received power level of a received signal in which gain control signal #803 and nondirectional transmission signal #801 are code multiplexed, thereby making it possible to set a dynamic range including the power level of a received signal in which nondirectional received signal #801 and directional received signal #804 are code multiplexed at time t2.

In this way, according to Embodiment 2, in addition to the above advantages of Embodiment 1, a gain control signal and a nondirectional transmission signal are code multiplexed, and thereby the overall power level of received signals becomes gradually larger after a gain control signal is received until a directional transmission signal is received, therefore at the transmitting side and receiving side without being aware of the timing when a gain control signal is transmitted and received, it is possible to perform normal AGC processing of averaging the received power level over a predetermined time and simplify the AGC processing.

A case has been explained in Embodiment 2 where a gain control signal is transmitted continuously from time t1 to time t2, but this is by no means limiting and is also applicable to cases where a gain control signal is transmitted once or a plurality of times at predetermined intervals. In addition, a case has been explained in Embodiment 2 where the power level of a gain control signal is made different for each frame, but this is by no means limiting and is also applicable to cases where the power level of a gain control signal is made different at an arbitrary timing such as for each slot. Furthermore, a case has been explained in Embodiment 2 where the transmission of gain control signals starts in the frame two frames before the frame in which the transmission of directional transmission signals starts, but this is by no means limiting and is also applicable to cases where the transmission of gain control signals starts in other frames than the frame two frames before the frame in which the transmission of directional transmission signals starts.

Embodiment 3

Figure 10:
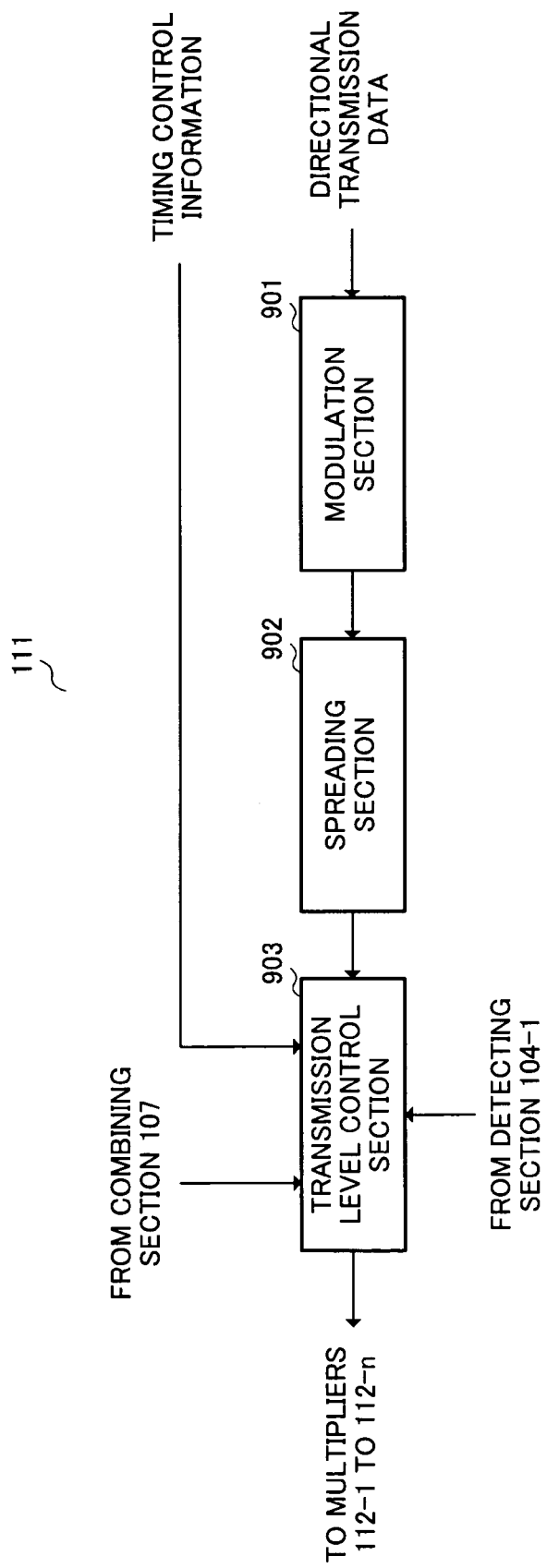
FIG. 10 is a block diagram showing a configuration of a directional signal generating section according to Embodiment 3 of the present invention.

FIG. 10 is a block diagram showing a configuration of directional signal generating section 111 according to Embodiment 3 of the present invention.

As shown in FIG. 10, directional signal generating section 111 according to Embodiment 3 of the present invention has modulation section 901 in place of modulation section 202 and transmission level control section 903 in place of transmission level controls section 204, removes gain control signal generating section 201 and gain control signal multiplex section 203, and adds spreading section 902, in directional signal generating section 111 according to Embodiment 1 shown in FIG. 3. In addition, parts in FIG. 10 that have identical configurations with ones in FIG. 3 will be assigned the same codes as in FIG. 3 without further explanations. Configurations of a transmission/reception apparatus and a reception apparatus that is a communicating party of a transmission/reception apparatus has the same configurations as FIG. 2 and FIG. 4, and therefore the explanation thereof is omitted.

Modulation section 901 modulates directional transmission data, generates a directional transmission signal, and outputs the generated directional transmission signal to spreading section 902.

Spreading section 902 performs spreading processing on the directional transmission signal inputted from modulation section 901 using a predetermined spreading code and outputs the result to transmission level control section 903.

In the case where timing control information is inputted, transmission level control section 903 sets the transmission power level of the directional transmission signal inputted from spreading section 902 so as to become gradually larger up to a predetermined level for each frame. Transmission level control section 903 outputs a directional transmission signal to multipliers 112-1 to 112-n after the transmission power level is set.

Figure 11:
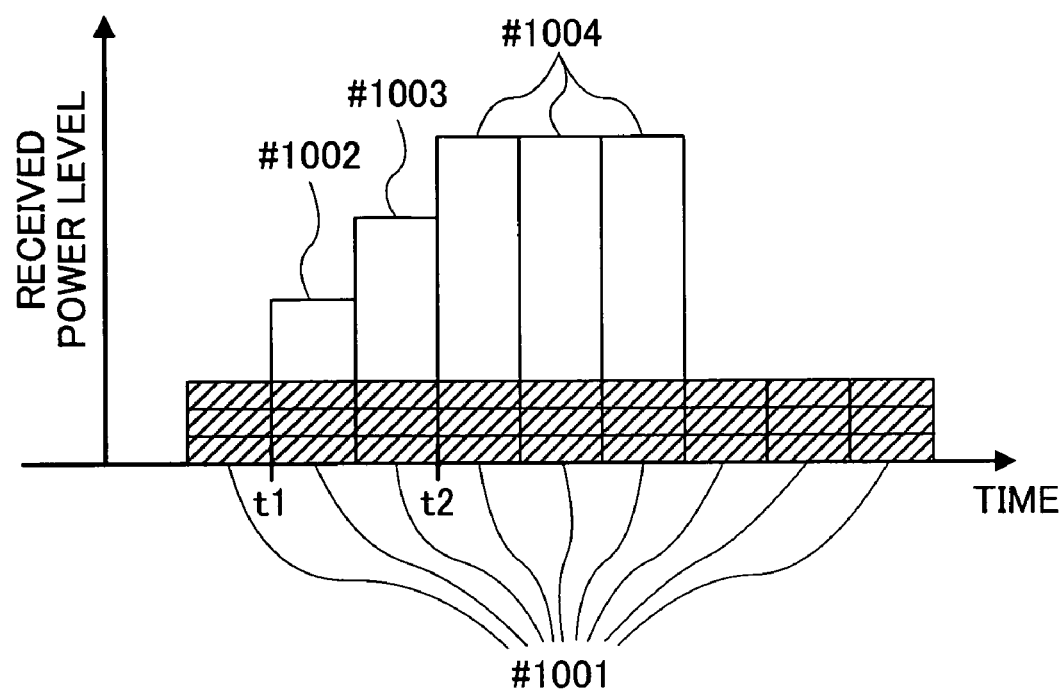
FIG. 11 illustrates relationships between the received power level and the received timing according to Embodiment 3 of the present invention.

FIG. 11 illustrates relationships between the received timing and received power level of nondirectional received signal #1001 and directional received signals #1002, #1003 and #1004 received at a reception apparatus. A view showing the change of the range of the dynamic range of AGC as time passes is the same as FIG. 5B, and therefore the explanation thereof is omitted.

As shown in FIG. 11, a transmission/reception apparatus receives a received signal in which nondirectional received signal #1001 and directional received signal #1002 are code multiplexed at time t1 when the frame two frames before the frame including directional received signal #1004 is received. A received signal in which nondirectional received signal #1001 and directional received signal #1002 are code multiplexed has a larger power level corresponding to the directional received signal #1002 multiplex than the power level of nondirectional received signal #1001. A received signal in which nondirectional received signal #1001 and directional received signal #1002 are code multiplexed has a smaller power level than the power level of a received signal in which nondirecitonal received signal #1001 and directional received signal #1004 are code multiplexed. Therefore, a transmission/reception apparatus at the receiving side, controls a gain according to the received power level of a received signal in which nondirectional transmission signal #1001 and directional transmission signal #1002 are code multiplexed, thereby making it possible to increase a dynamic range from time t1.

Furthermore, the transmission/reception apparatus receives a received signal in which nondirectional received signal #1001 and directional received signal #1003 are code multiplexed in the next frame of the frame including a received signal in which nondirectional received signal #1001 and directional received signal #1002 are code multiplexed. A received signal in which nondirectional received signal #901 and directional received signal #1003 are code multiplexed has a larger power level corresponding to the directional received signal #1003 multiplex than the power level of directional received signal #1003. The power level of directional received signal #1003 has a larger power level than the power level of directional received signal #1002, and therefore has a larger power level than the power level of a received signal in which nondirectional received signal #1001 and directional received signal #1002 are code multiplexed. A received signal in which nondirectional received signal #1001 and directional received signal #1003 are code multiplexed has a smaller power level than the power level of the received signal in which nondirectional received signal #1001 and directional received signal #1004 are code multiplexed. Therefore, the transmission/reception apparatus at the receiving side, controls a gain according to the received power level of a received signal in which nondirectional received signal #1001 and directional received signal #1003 are code multiplexed, thereby making it possible to set a dynamic range including the power level of a received signal in which nondirectional received signal #1001 and directional received signal #1004 are code multiplexed at time t2.

In this way, according to Embodiment 3, in addition to the above advantages of Embodiment 1, the power level of a directional transmission signal is set so that the power level of a directional transmission signal becomes gradually larger up to a predetermined value, therefore dynamic range can be adjusted using a directional transmission signal transmitting data, thereby making it possible to effectively use radio resources.

In addition, a case has been explained in Embodiment 3 where the power level is made different for each frame, but this is by no means limiting and is also applicable to cases where the power level is made different at an arbitrary timing such as for each slot. Furthermore, a case has been explained in Embodiment 3 where directional transmission signals #1002 and #1003 controlling a gain and a nondirectional transmission signal are code multiplexed, but this is by no means limiting and is also applicable to cases where, when directional transmission signals #1002 and #1003 are transmitted, a nondirectional transmission signal is not transmitted. Still further, a case has been explained in Embodiment 3 where directional transmission signal #1004 is controlled so that the power level of a received signal becomes gradually larger in the frame two frames before the frame in which directional transmission signal #1004 of a predetermined power level is received for the first time, but the present invention is not limited to this and is also applicable to cases where the power level of a directional transmission signal is controlled so that the power level of a received signal of a directional transmission signal at the receiving side becomes gradually larger in other frames than the frame two frames before the frame in which directional transmission signal #1004 of a predetermined power level is received for the first time.

Embodiment 4

Figure 12:
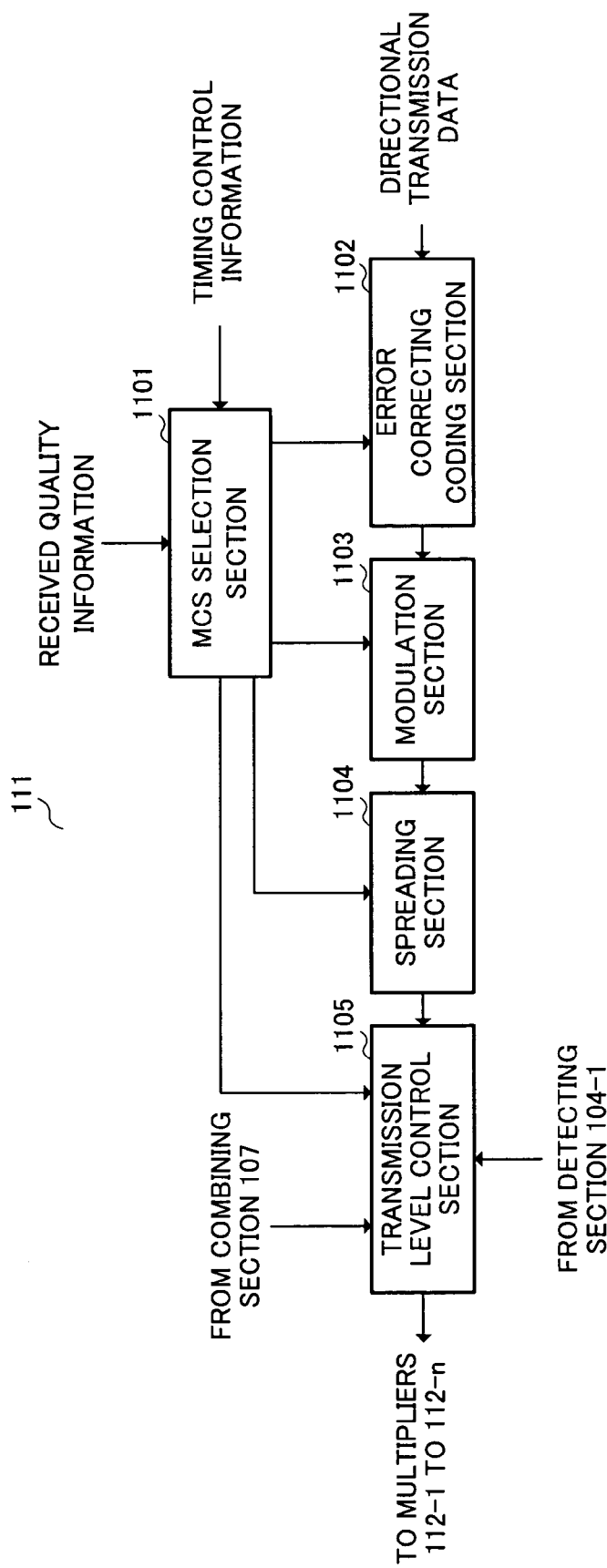
FIG. 12 is a block diagram showing a configuration of a directional signal generating section according to Embodiment 4 of the present invention.

FIG. 12 is a block diagram showing a configuration of directional signal generating section 111 according to Embodiment 4 of the present invention.

As shown in FIG. 12, directional signal generating section 111 according to Embodiment 4 removes gain control signal generating section 201 and gain control signal multiplex section 203, has modulation section 1103 in place of modulation section 202 and transmission level control section 1105 in place of transmission level control section 204, and adds MCS selection section 1101, error correcting coding section 1102 and spreading section 1104, in directional signal generating section 111 according to Embodiment 1 shown in FIG. 3. In addition, parts in FIG. 12 that have identical configurations with ones in FIG. 3 will be assigned the same codes as in FIG. 3 without further explanations. Configurations of a transmission/reception apparatus and a reception apparatus that is a communicating party of a transmission/reception apparatus has the same configurations as FIG. 2 and FIG. 4, and therefore the explanation thereof is omitted.

MCS selection section 1101 is a transmission rate selecting means and has an MCS table holding MCS selection information, and, in the case where timing control information is inputted, selects an MCS for a directional transmission signal based on received quality information such as CQI (Channel Quality Indicator) that is information of received quality for each communicating party. That is, MCS selection section 1101 selects MCS's so that the transmission rate becomes sequentially higher from a directional transmission signal of a small transmission power level to a directional transmission signal of the predetermined largest transmission power level. MCS selection section 1101 outputs the coding rate information that is information indicating coding rate to error correcting coding section 1102 by the selected MCS, outputs modulation scheme information that is information indicating the modulation scheme to modulation section 1103, and outputs spreading factor information indicating the spreading factor to spreading section 1104. MCS selection section 1101 outputs timing control information indicating a timing when MCS selection starts to transmission level control section 1105.

Error correcting coding section 1102 codes the directional transmission signal at the coding rate of the coding rate information inputted from MCS selection section 1101 and outputs the result to modulation section 1103.

Modulation section 1103 modulates the directional transmission signal inputted from error correcting coding section 1102 in modulation scheme of modulation scheme information inputted from MCS selection section 1101, and generates a directional transmission signal and outputs the generated directional transmission signal to spreading section 1104.

Spreading section 1104 performs spreading processing on the directional transmission signal inputted from modulation section 1103 at the spreading factor of spreading factor information inputted from MCS selection section 1101, and outputs the result to transmission level control section 1105.

Transmission level control section 1105 sets the transmission power level of a directional transmission signal inputted from spreading section 1104 at a predetermined timing from timing control information inputted from MCS selection section 1101 so that the transmission power level becomes gradually larger up to a predetermined level for each frame. Transmission level control section 1105 outputs the directional transmission signal to multipliers 112-1 to 112-n after the transmission power level is set.

Figures 13, 14:
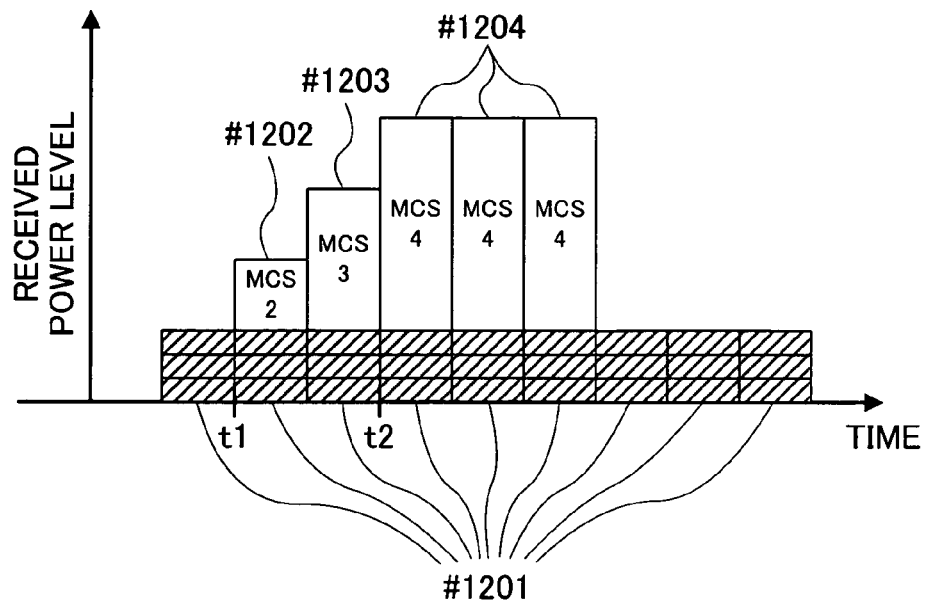
FIG. 13 illustrates relationships between the received power level and the received timing according to Embodiment 4 of the present invention.
FIG. 14 illustrates an MCS table according to Embodiment 4 of the present invention.

FIG. 13 illustrates relationships between the received timing and the received power level of nondirectional received signal #1201 and directional received signal #1202, #1203, and #1204 received at a reception apparatus. In addition, a view showing the change of the range of the dynamic range of AGC as time passes is the same as FIG. 5B, therefore the explanation thereof is omitted.

As shown in FIG. 13, a transmission/reception apparatus receives a received signal in which nondirectional received signal #1201 and directional received signal #1202 are code multiplexed at time t1 when the frame two frames before the frame including directional received signal #1204 is received. A received signal in which nondirectional received signal #1201 and directional received signal #1202 are code multiplexed has a larger power level corresponding to the directional received signal #1202 multiplex than the power level of nondirectional received signal #1201. Furthermore, the received signal in which nondirectional received signal #1201 and directional received signal #1202 are code multiplexed has a smaller power level than the power level of a received signal in which nondirectional received signal #1201 and directional received signal #1204 are code multiplexed. Therefore, a transmission/reception apparatus at the receiving side controls a gain according to the received power level of the received signal in which nondirectional received signal #1201 and directional received signal #1202 are code multiplexed, thereby making it possible to increase the dynamic range from time t1.

Furthermore, the transmission/reception apparatus receives a received signal in which nondirectional received signal #1201 and directional received signal #1203 are code multiplexed in the next frame of the frame including the received signal in which nondirectional received signal #1201 and directional received signal #1202 are code multiplexed. The received signal in which nondirectional received signal #1201 and directional received signal #1203 are code multiplexed has a larger power level corresponding to the directional received signal #1203 multiplex than the power level of nondirectional received signal #1201. The power level of directional received signal #1203 is larger than the power level of directional received signal #1202, therefore is larger than the power level of the received signal in which nondirectional received signal #1201 and directional received signal #1202 are code multiplexed. Furthermore, the received signal in which nondirectional received signal #1201 and directional received signal #1203 are code multiplexed has a smaller power level than the power level of a received signal in which nondirectional received signal #1201 and directional received signal #1204 are code multiplexed. Therefore, the transmission/reception apparatus at the receiving side, controls a gain according to the received power level of the received signal in which nondirectional received signal #1201 and directional received signal #1203 are code multiplexed, thereby making it possible to set a dynamic range including the power level of the received signal in which nondirectional received signal #1201 and directional received signal #1204 are code multiplexed at time t2.

MCS selection section 1101 has an MCS table shown in FIG. 14. MCS according to the transmission power level is set to directional received signals #1202, #1203 and #1204 at MCS selection section 1101. That is, MCS=2 is set for directional received signal #1202, MCS=3 is set for directional received signal #1203, and MCS=4 is set for directional received signal #1204. Here, the transmission rate becomes larger in order of MCS=1, MCS=2, MCS=3, and MCS=4. Therefore, unless the coding rate changes, the transmission rate becomes higher in response to an increase in the number of M-ary modulation level, and unless modulation scheme changes, the transmission rate becomes larger in response to an increase in the coding rate. In this way, modulation scheme and coding rate vary according to the selected MCS so that directional transmission signal subjected to spreading processing, modulated, and coding in different modulation scheme and at different coding rate according to the selected MCS.

In this way, according to Embodiment 4, in addition to the above advantages of Embodiment 1 and Embodiment 3, the transmission power level of a directional transmission signal is set to rise gradually up to a predetermined level, and MCS is selected according to the transmission power level so that it is possible to prevent deterioration of error rate characteristic and reliably perform reception demodulation at the receiving side.

In addition, a case has been explained in Embodiment 4 where the power level is made different for each frame, but this is by no means limiting and is also applicable to cases where the power level is made different at an arbitrary timing such as for each slot. Furthermore, a case has been explained in Embodiment 4 where directional transmission signal #1202 and #1203 subject to gain control and a nondirectional transmission signal are code multiplexed, but this is by no means limiting and is also applicable to cases where a nondirectional transmission signal is not transmitted when directional transmission signal #1202 and #1203 are transmitted. Still further, a case has been explained where the MCS table shown in FIG. 14 is used, but this is by no means limiting and is also applicable to cases where an MCS table combining an arbitrary modulation scheme and coding rate so that the transmission rate becomes larger in order of the MCS from MCS=1 to MCS=4 is used. Furthermore, a case has been explained in Embodiment 4 where the transmission power level of a directional transmission signal is controlled so that the received power level of a received signal becomes gradually larger from two frames before the frame in which directional transmission signal #1204 is received for the first time, but this is by no means limiting and is also applicable to cases where the power level of a directional transmission signal is controlled so that the power level of a received signal of a directional transmission signal at the receiving side becomes gradually larger in other frames than the frame two frames before the frame in which directional transmission signal #1204 of a predetermined power level is received for the first time.

Embodiment 5

Figure 15:
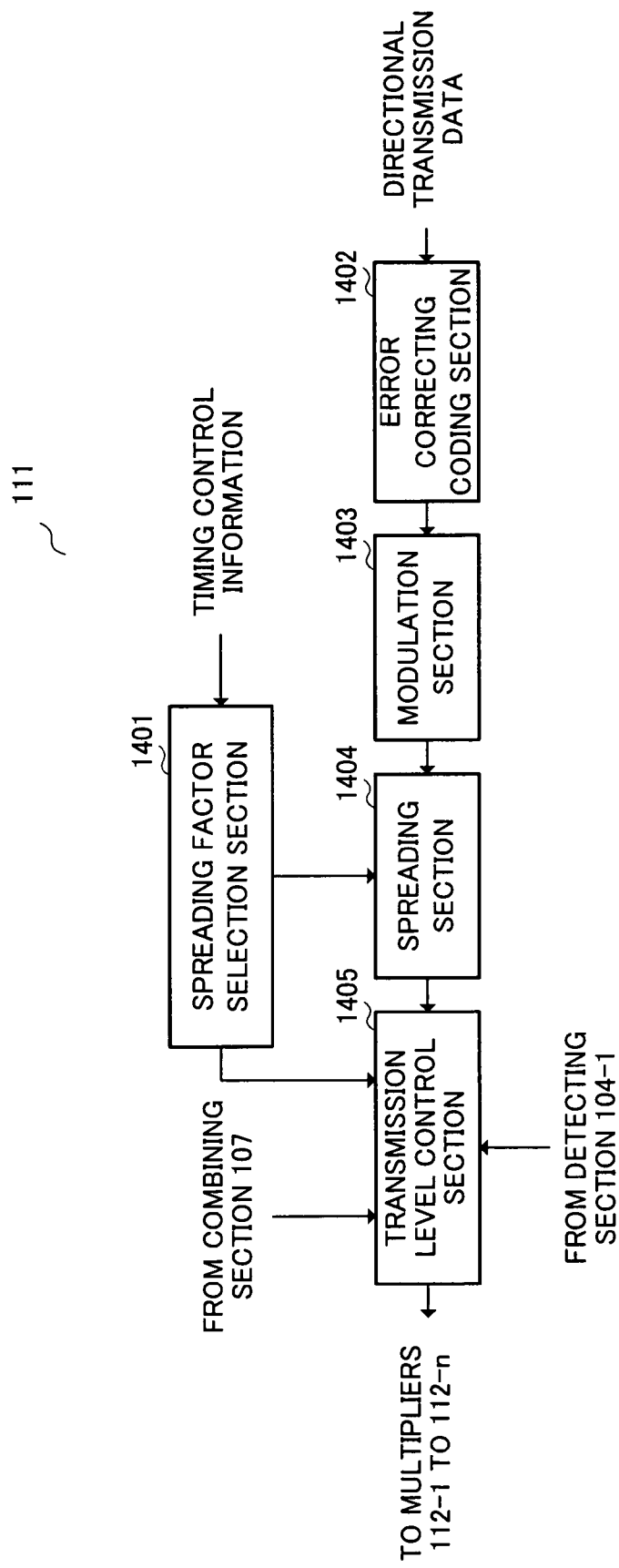
FIG. 15 is a block diagram showing a configuration of a directional signal generating section according to Embodiment 5 of the present invention.

FIG. 15 is a block diagram showing a configuration of directional signal generating section 111 according to Embodiment 5 of the present invention.

As shown in FIG. 15, directional signal generating section 111 according to Embodiment 5 removes gain control signal generating section 201 and gain control signal multiplex section 203, has modulation section 1403 in place of modulation section 202 and transmission level control section 1405 in place of transmission level control section 204, and adds spreading selection section 1401, error correcting coding section 1402 and spreading section 1404 in directional signal generating section 111 according to Embodiment 1 shown in FIG. 3. In addition, parts in FIG. 15 that have identical configurations with ones in FIG. 3 will be assigned the same codes as in FIG. 3 without further explanations. Configurations of a transmission/reception apparatus and a reception apparatus that is a communicating party of a transmission/reception apparatus has the same configurations as FIG. 2 and FIG. 4, and therefore the explanation thereof is omitted.

Spreading factor selection section 1401 selects the spreading factor of a directional transmission signal in the case where timing control information is inputted. That is, spreading factor selection section 1401 selects the spreading factor so that the spreading factor becomes sequentially smaller from a directional transmission signal of small transmission power level to a directional transmission signal of predetermined largest transmission power level. Spreading factor selection section 1401 outputs spreading factor information that is information indicating the selected spreading factor to spreading section 1404. Spreading factor selection section 1401 outputs a timing control signal that is information of the timing when the selection of the spreading factor is started to transmission level control section 1405.

Error correcting coding section 1402 codes a directional transmission signal and outputs the result to modulation section 1403.

Modulation section 1403 modulates directional transmission data inputted from error correcting coding section 1402, generates a directional transmission signal, and outputs the generated directional transmission signal to spreading section 1404.

Spreading section 1404 performs spreading processing on the directional transmission signal inputted from modulation section 1403 using a predetermined spreading code and outputs the result to transmission level control section 1405.

Transmission level control section 1405 sets the transmission power level of the directional transmission signal inputted from spreading section 1404 from timing control information inputted from spreading factor selection section 1401 at a timing when a directional transmission signal is inputted from spreading section 1404 so that the transmission power level becomes gradually larger up to a predetermined level for each frame. Transmission level control section 1405 outputs a directional transmission signal to adder 113 and multipliers 112-1 to 112-n after the transmission power level is set.

Figure 16:
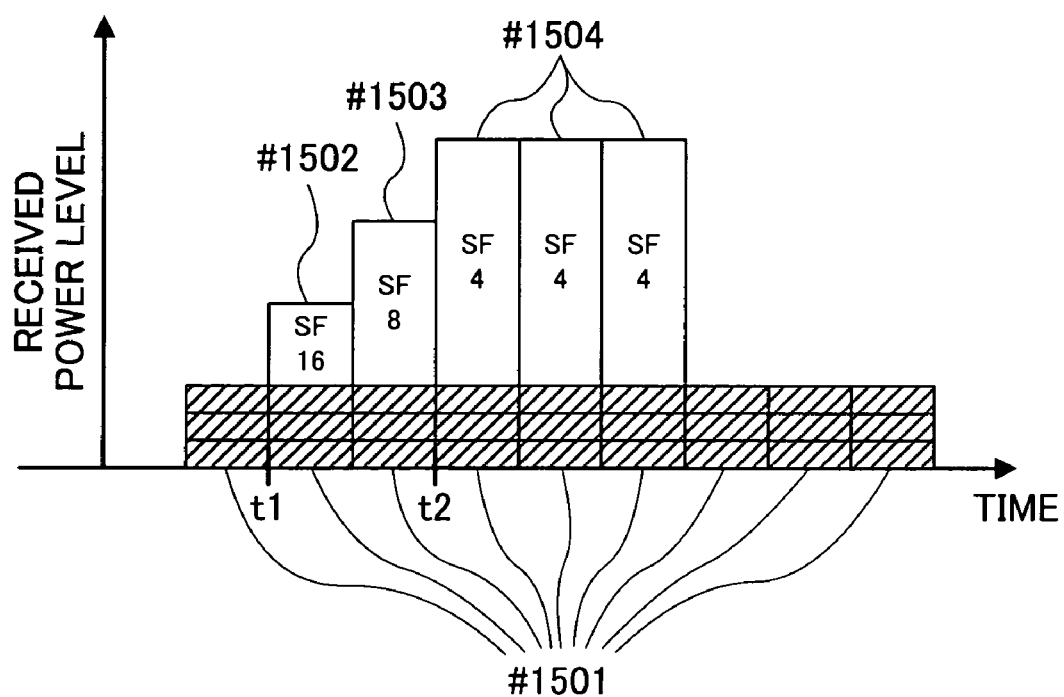
FIG. 16 illustrates relationships between the received power level and the received timing according to Embodiment 5 of the present invention.

FIG. 16 illustrates relationships between the received timing and the received power level of nondirectional received signal #1501 and directional received signal #1502, #1503 and #1504 received at a reception apparatus. In addition, a view showing the change of the range of the dynamic range of AGC is the same as FIG. 5B, and therefore the explanation thereof is omitted.

As shown in FIG. 16, a transmission/reception apparatus receives a received signal in which nondirectional received signal #1501 and directional received signal #1502 are code multiplexed, at time t1 when the frame two frames before the frame including directional received signal #1504 is received. The received signal in which nondirectional received signal #1501 and directional received signal #1502 are code multiplexed has a larger power level corresponding to the directional received signal #1502 multiplex than the power level of nondirectional received signal #1501. Furthermore, the received signal in which nondirectional received signal #1501 and directional received signal #1502 are code multiplexed has a smaller power level than the power level of a received signal in which nondirectional received signal #1501 and directional received signal #1504 are code multiplexed. Therefore, the transmission/reception apparatus at the receiving side controls a gain according to the received power level of the received signal in which nondirectional received signal #1501 and directional received signal #1502 are code multiplexed, and thereby increasing the dynamic range from time t1.

Further, the transmission/reception apparatus receives a received signal in which nondirectional received signal #1501 and directional received signal #1503 are code multiplexed in the next frame of the frame including the received signal in which nondirectional received signal #1501 and directional received signal #1502 are code multiplexed. The received signal in which nondirectional received signal #1501 and directional received signal #1503 are code multiplexed has a larger power level corresponding to the directional received signal #1503 multiplex than the power level of nondirectional received signal #1501. The power level of directional received signal #1503 is larger than the power level of directional received signal #1502, and therefore is larger than the power level of the received signal in which nondirectional received signal #1501 and directional received signal #1502 are code multiplexed. The received signal in which nondirectional received signal #1501 and directional received signal #1503 are code multiplexed has a smaller power level than the power level of a received signal in which nondirectional received signal #1501 and directional received signal #1504 are code multiplexed. Therefore, the transmission/reception apparatus at the receiving side controls a gain according to the received power level of the received signal in which nondirectional received signal #1501 and directional received signal #1503 are code multiplexed, thereby making it possible to set a dynamic range including the power level of the received signal in which nondirectional received signal #1501 and directional received signal #1504 are code multiplexed at time t2.

The spreading factor is selected for directional received signals #1502, #1503, and #1504 according to the transmission power level at spreading factor selection section 1401. That is, spreading factor SF=16 is set for directional received signal #1502, spreading factor SF=8 is set for directional received signal #1503, and spreading factor SF=4 is set for directional received signal #1504. Here, the spreading factor becomes smaller at SF=16, SF=8, and SF=4 in order.

In this way, according to Embodiment 5, in addition to the above advantages of Embodiment 1 and Embodiment 3, the transmission power level of a directional transmission signal is set so as to gradually become larger up to a predetermined level, and spreading factor is selected according to the transmission power level, and therefore it is possible to prevent deterioration of error rate characteristic and reliably perform reception demodulation at the receiving side.

In addition, a case has been explained in Embodiment 5 where the power level is made different for each frame, but this is by no means limiting and is also applicable to cases where the power level is made different at an arbitrary timing such as for each slot. Furthermore, a case has been explained in Embodiment 5 where directional transmission signal #1502 and #1503 subject to gain control and a nondirectional transmission signal are code multiplexed, but this is by no means limiting and is also applicable to cases where a nondirectional transmission signal is not transmitted when directional transmission signal #1502 and #1503 are transmitted. Still further, a case has been explained in Embodiment 5 where the transmission power level of a directional transmission signal is controlled so that the power level of a received signal of a directional transmission signal becomes gradually larger from two frames before the frame in which directional transmission signal #1504 of a predetermined power level is received for the first time, but this is by no means limiting and is also applicable to cases where the power level of a directional transmission signal is controlled so that the power level of a received signal of a directional transmission signal at the receiving side becomes gradually larger in other frames than the frame two frames before the frame in which directional transmission signal #1504 of a predetermined power level is received for the first time.

Embodiment 6

Figure 17:
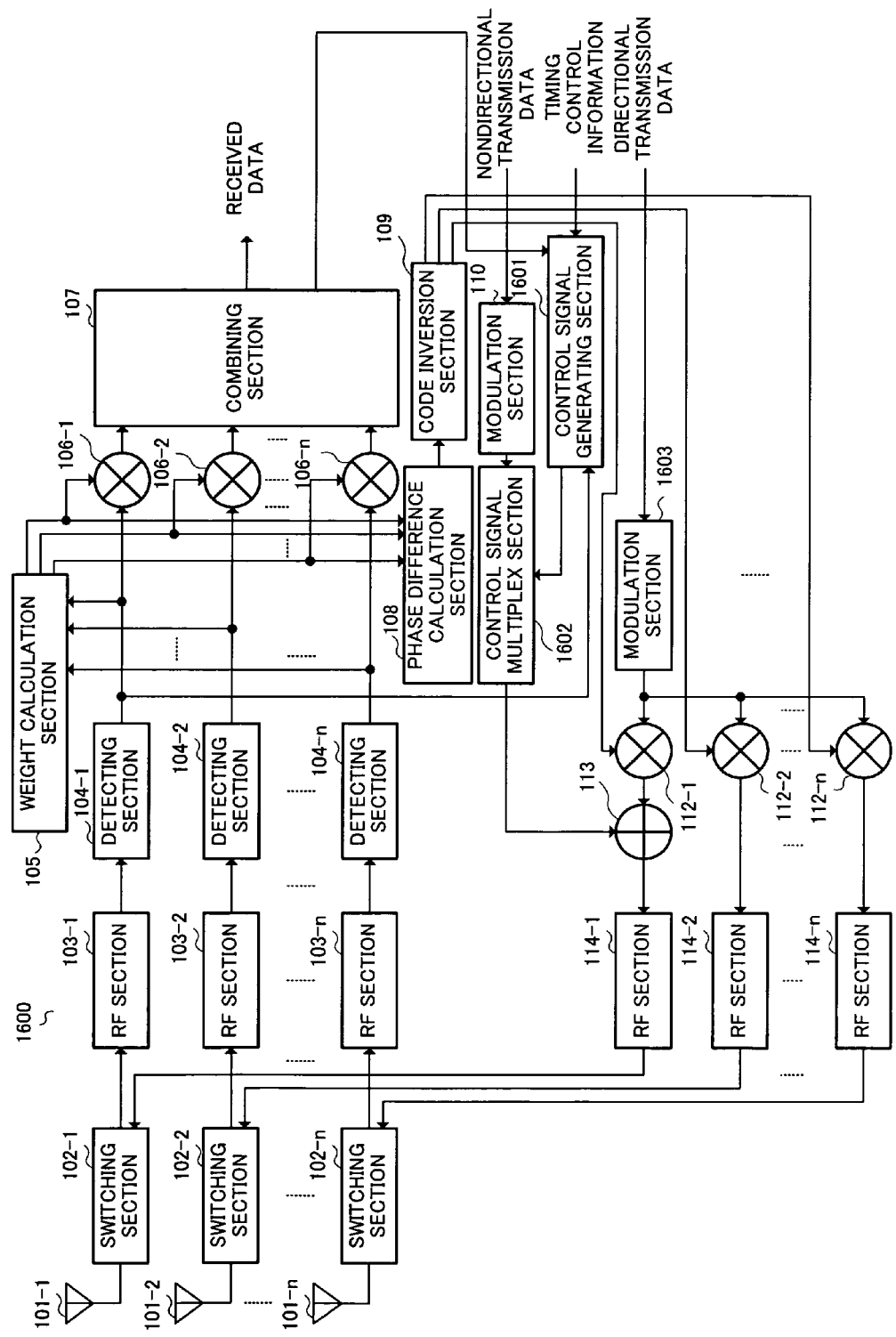
FIG. 17 is a block diagram showing a configuration of a transmission/reception apparatus according to Embodiment 6 of the present invention.

FIG. 17 is a block diagram showing a configuration of transmission/reception apparatus 1600 according to Embodiment 6 of the present invention.

As shown in FIG. 17, transmission/reception apparatus 1600 removes directional signal generating section 111, and adds control signal generating section 1601, control signal multiplex section 1602 and modulation section 1603 in transmission/reception apparatus 100 according to Embodiment 1 shown in FIG. 2. In addition, parts in FIG. 17 that have identical configurations with ones in FIG. 2 will be assigned the same codes as in FIG. 2 without further explanations.

Control signal generating section 1601 obtains a ratio between the received power of a received signal at one antenna 101-1 inputted from detecting section 104-1 and the received power of a received signal received with directivity inputted from combining section 107, and generates a control signal including information of the obtained ratio of the received power and information of a timing when a directional transmission signal is transmitted (power level information.) Control signal generating section 1601 outputs the generated control signal to control signal multiplex section 1602 at a timing of the frame three frames before the frame in which the transmission of directional transmission signals starts based on timing control information. In addition, a control signal is not limited to the ratio of the received power, and may be information of difference between the received power of a received signal received at one antenna 101-1 inputted from detecting section 104-1 and the received power of a received signal received with directivity at a plurality of antennas 101-1 to 101-n inputted from combining section 107.

Control signal multiplex section 1602 multiplexes the nondirectional transmission signal inputted from modulation section 110 including a control signal and outputs the result to adder 113.

Modulation section 1603 modulates a directional transmission signal, generates a directional transmission signal and outputs the generated directional transmission signal to multipliers 112-1 to 112-n.

Adder 113 adds the control signal and the nondirectional transmission signal inputted from control signal multiplex section 1602 and the directional transmission signal inputted from multiplier 112-1, thereby time division multiplexing a control signal and a directional transmission signal and outputting the result to RF section 114-1.

Figure 18:
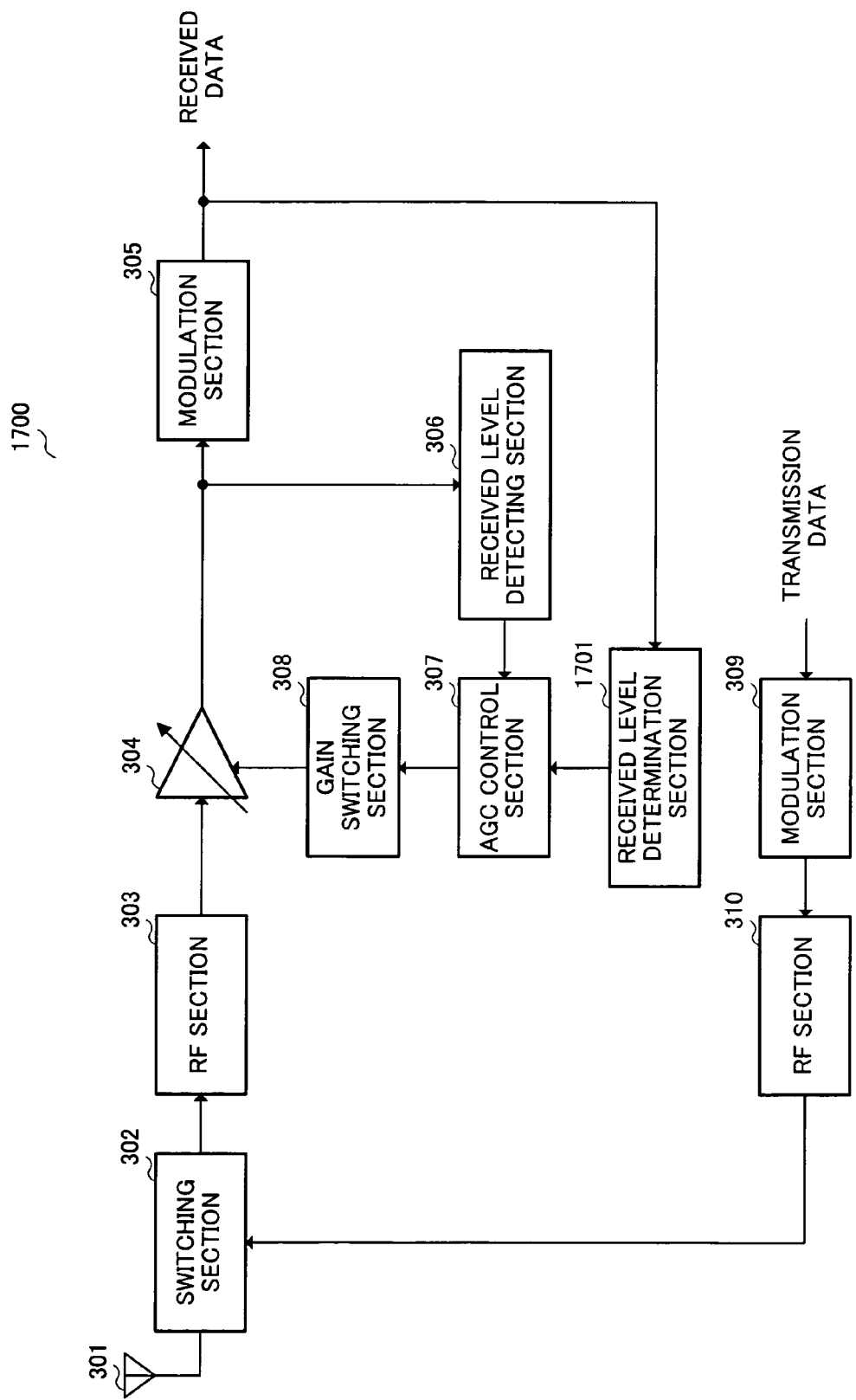
FIG. 18 is a block diagram showing a configuration of a transmission/reception apparatus according to Embodiment 6 of the present invention.

Next, a configuration of transmission/reception apparatus 1700 that is a communicating party of transmission/reception apparatus 1600 will be described using FIG. 18. FIG. 18 is a block diagram showing a configuration of transmission/reception apparatus 1700.

As shown in FIG. 18, transmission/reception apparatus 1700 according to Embodiment 6 adds received level determining section 1701 to transmission/reception apparatus 300 according to Embodiment 1 shown in FIG. 4. In addition, parts in FIG. 18 that have identical configurations with ones in FIG. 4 will be assigned the same codes as in FIG. 4 without further explanations.

Received level determining section 1701 extracts the control signal from the demodulated received signal inputted from modulation section 305 and can learn the received power level of the directional transmission signal transmitted from transmission/reception apparatus 1600 from the extracted control signal, and therefore determines the received power level of the directional transmission signal using the control signal. Received level determining section 1701 outputs information of the determined received power level of the directional transmission signal and information of the received timing to AGC control section 307.

AGC control section 307 determines a gain for variable gain amplifier 304 so that the received level measured by detecting section 306 becomes a desired received level by the similar method to the above described Embodiment 1 and outputs gain information that is information of the determined gain to gain switching section 308. On the other hand, in the case where information of the received power level and the received timing is inputted from received level determining section 1701, AGC control section 307 determines a gain without using the detection result of received level detecting section 306, corresponding to the received power level determined at received level determining section 1701 at the timing when a directional transmission signal is received by the information of received timing inputted from receiving level determining section 1701, and outputs gain information that is information of the determined gain, to gain switching section 308.

Figure 19:
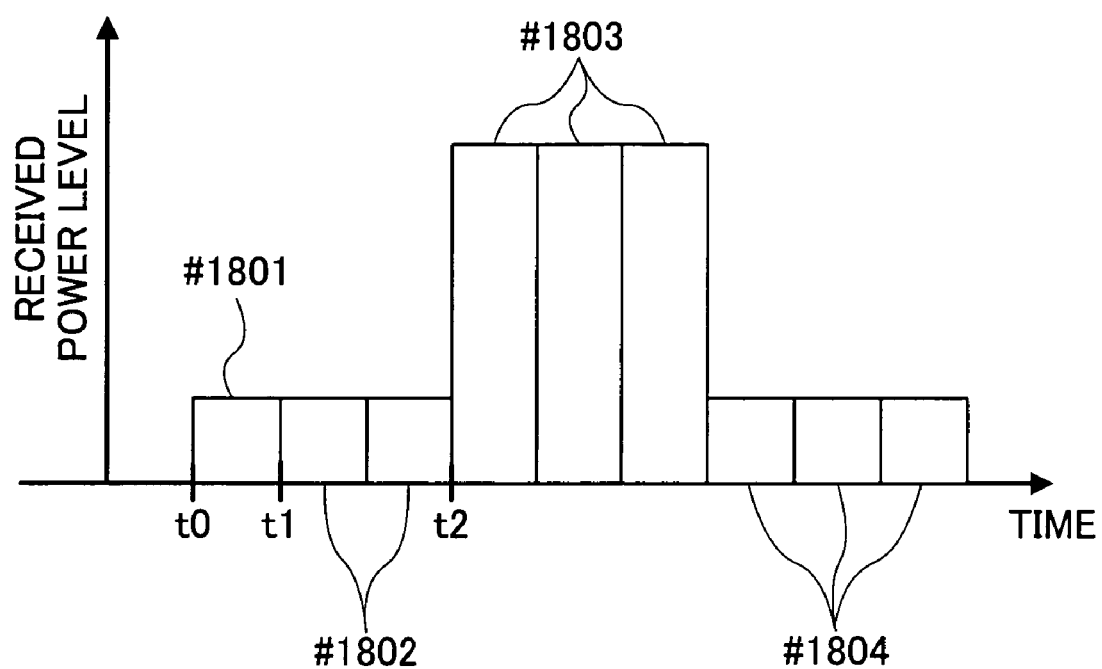
FIG. 19 illustrates relationships between the received power level and the received timing according to Embodiment 6 of the present invention.

FIG. 19 illustrates relationships between the received timing and the received power level of nondirectional received signal #1801, #1802 and #1804, and directional received signal #1803 received at a reception apparatus. In addition, a view showing the change of the range of a dynamic range of AGC as time passes is the same as FIG. 5B, and therefore the explanation thereof is omitted.

As shown in FIG. 19, a reception apparatus extracts control information included in nondirectional received signal #1801 at time t0 when the frame three frames before the frame including directional received signal #1803 is received, and learns the transmission power of directional received signal #1803. By this means, it is possible to increase the dynamic range from time t1 and set a dynamic range including the power level of directional received signal #1803 at time t2 when directional received signal #1803 is received.

In this way, according to Embodiment 6, information of the difference between the power level of a nondirectional transmission signal and the power level of a directional transmission signal is included in a nondriectional transmission signal, and the information of the difference is transmitted at timing a little before the timing of the transmission of a directional transmission signal, and therefore it is possible to set a large dynamic range before a directional transmission signal is received, thereby making it possible to lower the possibility of failing reception demodulation and prevent deterioration of transmission efficiency caused by retransmission.

In addition, a case has been explained in Embodiment 6 where a control signal is transmitted in a frame three frames before the frame in which the transmission of directional transmission signals starts, but this is by no means limiting and is also applicable to cases where a control signal is transmitted in an arbitrary frame before the frame in which the transmission of a directional transmission signal starts, and a control signal is transmitted at an arbitrary timing a predetermined time before a directional transmission signal is transmitted. Furthermore, a case has been explained where a control signal is transmitted in a frame three frames before the frame in which a directional transmission signal is transmitted, but this is by no means limiting and is also applicable to cases where a control signal is transmitted in the same frame as the frame in which a directional transmission signal is transmitted.

In addition, transmission/reception apparatus 100, 500 and 1600 of above-described Embodiment 1 to Embodiment 6 are applicable to communication terminal apparatus or base station apparatus. Furthermore, transmission/reception apparatus 300, 700 and 1700 of above-described Embodiment 1 to Embodiment 6 are applicable to base station apparatus or communication terminal apparatus.

INDUSTRIAL APPLICABILITY

The transmission/reception apparatus and gain control method of the present invention can lower the possibility of failing reception demodulation in communication where data is transmitted with and without directivity and has advantages of preventing deterioration of transmission efficiency caused by retransmission, and is useful in gain control.

The present description is based on the Japanese Patent Application No. 2003-385081 filed on Nov. 14, 2003, entire content of which is expressly incorporated by reference herein.

The invention claimed is:

1. A transmission apparatus comprising:
    a gain control signal generating section that generates a gain control signal comprising a signal for adjusting a gain for a received signal of a communicating party;
    a gain control signal multiplex section that time division multiplexes a directional transmission signal and the gain control signal so that the gain control signal is transmitted a predetermined time before a frame in which the directional transmission signal is transmitted in bursts;
    a transmission level control section that sets a transmission power level of the gain control signal so that a transmission power level of the gain control signal is smaller than a transmission power level of the directional transmission signal and a received power level of the gain control signal is larger than a received power level at a communicating party of a nondirectional transmission signal; and
    a transmission section that transmits the directional transmission signal and the gain control signal at the transmission power level set at said transmission level control section with directivity, and transmits the nondirectional transmission signal without directivity.

2. The transmission apparatus according to claim 1, comprising a code multiplex section that code multiplexes the nondirectional transmission signal and the gain control signal, wherein:
    said transmission level control section sets the transmission power level of the gain control signal so that the received power level adding the received power level of the gain control signal code multiplexed at said code multiplex section and the received power level of the nondirectional transmission signal is smaller than the received power level of the directional transmission signal; and
    said transmission section transmits the gain control signal and the directional transmission signal with directivity and transmits the nondirectional transmission signal without directivity.

3. The transmission apparatus according to claim 1, wherein said transmission level control section obtains a received power level ratio between a received power level of a received signal at one antenna receiving a signal transmitted from a communicating party and a received power level of a received signal in which a signal transmitted from the communicating party is received with directivity at a plurality of antennas including said one antenna, and sets a transmission power level of the gain control signal so that a power level obtained by dividing a transmission power level of the gain control signal by the received power level ratio is larger than a transmission power level of the nondirectional transmission signal.

4. A transmission apparatus comprising:
    a control signal generating section that obtains a received power level ratio between a received power level of a received signal at one antenna receiving a signal transmitted from a communicating party and a received power level of a received signal in which a signal transmitted from the communicating party is received with directivity and generates power level information comprising information of the received power level ratio;
    a control signal multiplex section that time division multiplexes a directional transmission signal and the power level information so that the power level information comprising information of the received power level of the directional transmission signal at the communicating party is transmitted to the communicating party before the directional transmission signal is transmitted; and
    a transmission section that transmits the power level information and the directional transmission signal multiplexed at the control signal multiplex section with directivity.

5. A gain control method comprising steps of:
    generating a gain control signal comprising a signal for adjusting a gain for a received signal of a communicating party;
    time division multiplexing a directional signal and the gain control signal so that the gain control signal is transmitted a predetermined time before a frame in which the directional signal is transmitted in bursts;
    setting a transmission power level of the gain control signal so that a transmission power level of the gain control signal is smaller than the transmission power level of the directional signal and a received power level of the gain control signal is larger than a received power level of a nondirectional signal at a communicating party;

transmitting the directional signal and the gain control signal at the set transmission power level with directivity and transmits the nondirectional signal without directivity; and controlling a gain at a dynamic range including the received power level of the received nondirectional signal, the gain control signal and the directional signal.

* * * * *

UNITED STATES PATENT AND TRADEMARK OFFICE
CERTIFICATE OF CORRECTION

PATENT NO. : 7,418,242 B2  Page 1 of 1
APPLICATION NO. : 10/579062
DATED : August 26, 2008
INVENTOR(S) : Atsushi Sumasu et al.

It is certified that error appears in the above-identified patent and that said Letters Patent is hereby corrected as shown below:

On the title page: Item (54) and column 1, line 1 currently reads:

(54) TRANSMISSION DEVICE AND GAIN CONTROL METHOD and should read:

(54) TRANSMISSION APPARATUS AND GAIN CONTROL METHOD

On the title page: Item (56), under Foreign Patent Documents currently reads:

FOREIGN PATENT DOCUMENTS

| JP | 8288881 | 11/1996 |
| JP | 1051380 | 2/1998 |
| JP | 2003 134025 | 5/2003 | and should read:

FOREIGN PATENT DOCUMENTS

| JP | 8288881 | 11/1996 |
| JP | 1051380 | 2/1998 |
| JP | 2000 151487 | 5/2000 |
| JP | 2003 134025 | 5/2003 |

Signed and Sealed this

Twenty-fifth Day of August, 2009

David J. Kappos
*Director of the United States Patent and Trademark Office*